(12) United States Patent
Tsai et al.

(10) Patent No.: US 11,462,509 B2
(45) Date of Patent: Oct. 4, 2022

(54) PACKAGE STRUCTURE WITH ELECTRONIC DEVICE IN CAVITY SUBSTRATE AND METHOD FOR FORMING THE SAME

(71) Applicant: Taiwan Semiconductor Manufacturing Co., Ltd., Hsinchu (TW)

(72) Inventors: Po-Hao Tsai, Zhongli (TW); Ming-Da Cheng, Taoyuan (TW); Mirng-Ji Lii, Sinpu Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 42 days.

(21) Appl. No.: 16/918,188

(22) Filed: Jul. 1, 2020

(65) Prior Publication Data

US 2021/0125961 A1 Apr. 29, 2021

Related U.S. Application Data

(60) Provisional application No. 62/927,182, filed on Oct. 29, 2019.

(51) Int. Cl.
| | |
|---|---|
| *H01L 25/065* | (2006.01) |
| *H01L 23/538* | (2006.01) |
| *H01L 25/00* | (2006.01) |
| *H01L 23/31* | (2006.01) |
| *H01L 23/42* | (2006.01) |

(Continued)

(52) U.S. Cl.
CPC .......... *H01L 25/0652* (2013.01); *H01L 21/52* (2013.01); *H01L 21/56* (2013.01); *H01L 23/3128* (2013.01); *H01L 23/42* (2013.01); *H01L 23/5383* (2013.01); *H01L 23/5384* (2013.01); *H01L 23/5385* (2013.01); *H01L 23/5389* (2013.01); *H01L 25/50* (2013.01)

(58) Field of Classification Search
CPC ........ H01L 21/52; H01L 21/56; H01L 23/42; H01L 23/5383; H01L 23/5384; H01L 23/5385; H01L 23/5389
USPC ......................................................... 257/668
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |

(Continued)

*Primary Examiner* — Quoc D Hoang
(74) *Attorney, Agent, or Firm* — McClure, Qualey & Rodack, LLP

(57) ABSTRACT

A package structure is provided. The package structure includes a substrate having a first surface and a second surface opposite the first surface. The substrate includes a cavity extending from the second surface toward the first surface, and thermal vias extending from a bottom surface of the cavity to the first surface. The package structure also includes at least one electronic device formed in the cavity and thermally coupled to the thermal vias. In addition, the package structure includes an insulating layer formed over the second surface and covering the first electronic device. The insulating layer includes a redistribution layer (RDL) structure electrically connected to the electronic device. The package structure also includes an encapsulating material formed in the cavity, extending along sidewalls of the electronic device and between the electronic device and the insulating layer.

20 Claims, 23 Drawing Sheets

(51) Int. Cl.
    *H01L 21/52*     (2006.01)
    *H01L 21/56*     (2006.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2009/0057873 A1* | 3/2009 | Hsu .................. H01L 24/82 257/700 |
| 2010/0301474 A1* | 12/2010 | Yang .................. H01L 24/29 257/737 |

\* cited by examiner

PACKAGE STRUCTURE WITH ELECTRONIC DEVICE IN CAVITY SUBSTRATE AND METHOD FOR FORMING THE SAME

PRIORITY CLAIM AND CROSS-REFERENCE

This Application claims the benefit of U.S. Provisional Application No. 62/927,182, filed on Oct. 29, 2019, which is hereby incorporated herein by reference.

BACKGROUND

The semiconductor industry continues to find ways to improve the integration density of various electronic components (e.g., transistors, diodes, resistors, capacitors, etc.) by continual reductions in minimum feature size, which allow more components, and hence more functions, to be integrated into a given area. As the demand for ever-smaller electronic devices grows, a need for smaller and more creative packaging techniques for semiconductor dies has emerged.

A chip package not only provides protection for semiconductor devices from environmental contaminants, but also provides a connection interface for the semiconductor devices packaged therein. Smaller package structures, which utilize a smaller area or are lower in height, have been developed to package the semiconductor devices.

Although various packaging technologies have been developed to further improve the density and functionalities of semiconductor dies, these packaging technologies still face manufacturing challenges.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
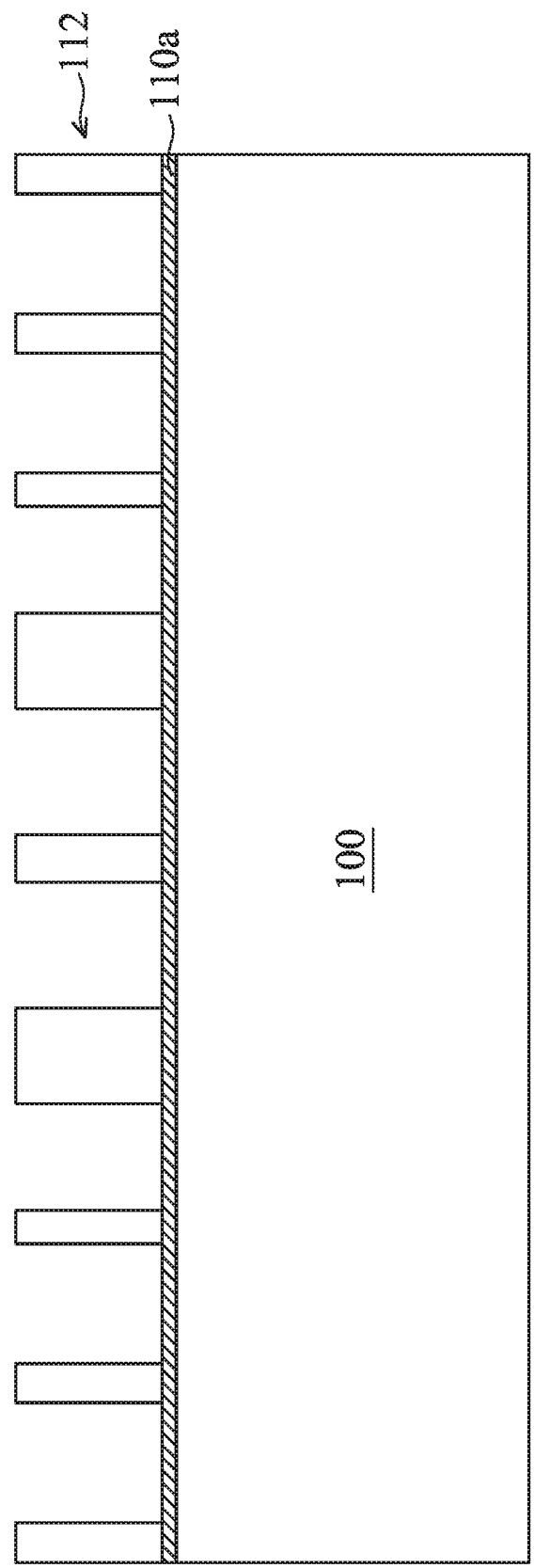
FIGS. 1A to 1G illustrate perspective views of various stages of manufacturing a package substrate with a cavity for a package structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A to 1G illustrate perspective views of various stages of manufacturing a package substrate with a cavity for a package structure in accordance with some embodiments. As shown in FIG. 1A, a metal seed layer 110a is formed over a carrier substrate 100, in accordance with some embodiments. The carrier substrate 100 may be a glass substrate, a semiconductor substrate, or another suitable substrate. The metal seed layer 100a may be a copper layer and formed by a deposition process, such as a chemical vapor deposition (CVD) process, a physical vapor deposition (PVD) process, or another suitable deposition process.

Alternatively, an adhesive tape (not shown) is formed on the carrier substrate 100 before the formation of the metal seed layer 110a. The adhesive tape may be sensitive to an energy beam irradiation. In some embodiments, the adhesive tape a release layer that is made of or includes a light-to-heat conversion (LTHC) material. For example, a laser beam may be used to irradiate the adhesive tape. The irradiation may allow the removal of the carrier substrate 100 from the overlying structure subsequently formed. In some other embodiments, the adhesive tape is a thermal release film. For example, a thermal energy may be applied to the thermal release film for the removal of the carrier substrate 100.

Afterwards, a patterned masking layer 112 is formed over the metal seed layer 110a to expose portions of the metal seed layers 110a, in accordance with some embodiments. The patterned masking layer 112 may include photoresist, such as a dry film, and be patterned by a lithography process. The patterned masking layer 112 includes a pattern (e.g., openings) to define a portion of the subsequently formed redistribution layer (RDL) structure. The RDL structure is used for routing, which enables the formation of a package structure with fan-out features.

Figure 1B:
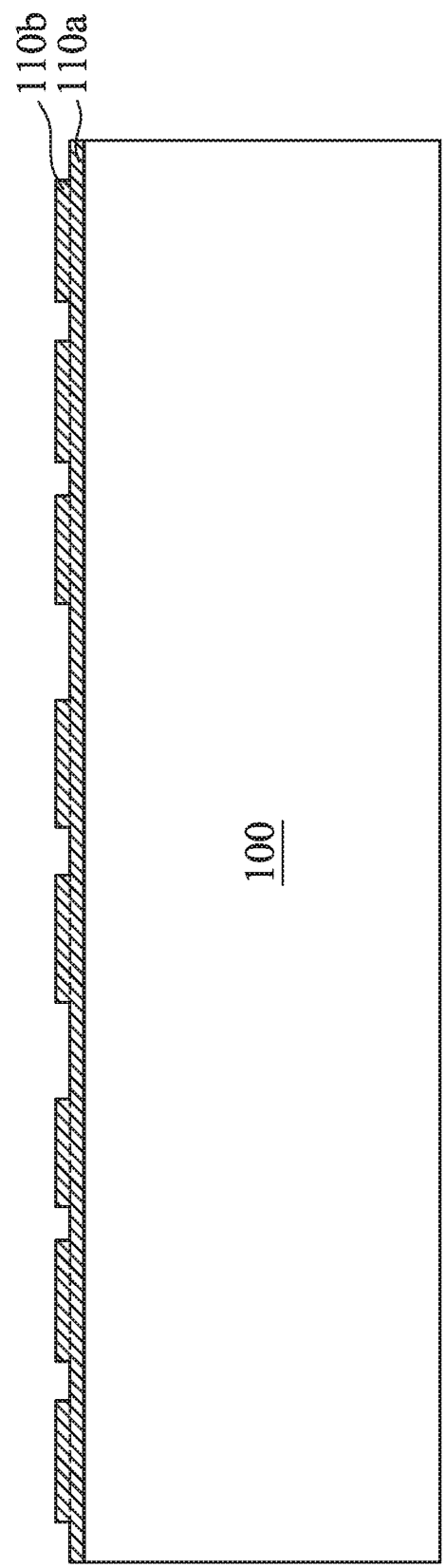

A patterned conductive layer 110b is formed over the exposed portions of the metal seed layers 110a, as shown in FIG. 1B in accordance with some embodiments. In some embodiments, the patterned conductive layer 110b is made of copper and formed by an electroplating process or an electroless process, so that the patterned conductive layer 110b is formed over the exposed portions of the metal seed layers 110a. After the patterned conductive layer 110b is formed, the patterned masking layer 112 is removed by, for example, a wet stripping process or a dry ashing process. The resulting structure is shown in FIG. 1B.

Figure 1C:
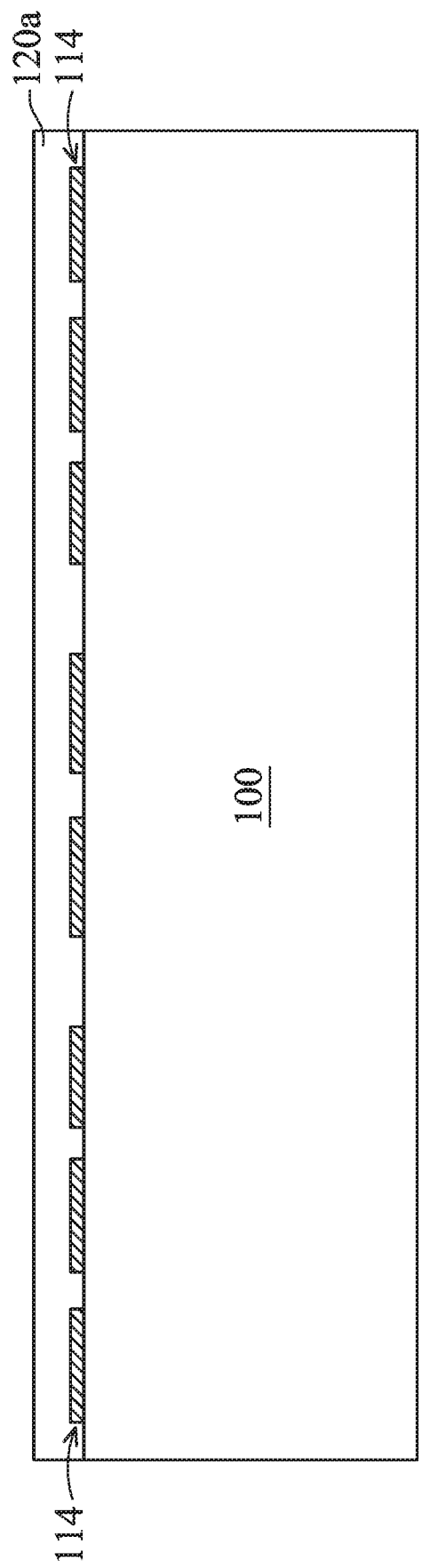

Afterwards, the metal seed layers 110a uncovered by the patterned masking layer 112 is removed by an etching process, so as to expose portions of the carrier substrate 100. After the metal seed layers 110a is etched, the patterned conductive layer 110b and the remaining metal seed layers 110a form conductive features 114, as shown in FIG. 1C in accordance with some embodiments. In some embodiments, the formed conductive features 114 include conductive lines and/or conductive pads for a subsequently formed RDL structure. The conductive lines and/or conductive pads provide electrical connection in horizontal directions.

Afterwards, an insulating layer 120a is formed over the carrier substrate 100 and covers the top surfaces and sidewalls of the conductive features 114, as shown in FIG. 1C in accordance with some embodiments. The insulating layers 120a may be made of or include one or more polymer materials. The polymer material(s) may include ABF (Ajinomoto Build-up Film), polypropylene (PP), polybenzoxazole (PBO), polyimide (PI), epoxy-based resin, one or more other suitable polymer materials, or a combination thereof. In some embodiments, the polymer material is photosensitive. A photolithography process may therefore be used to form openings with desired patterns in the insulating layer 120a. The deposition or coating processes (e.g., a thermal lamination process, a spin coating process, a CVD process, one or more other applicable processes, or a combination thereof) may be used to form the insulating layer 120a. For example, the insulating layers 120a is made of polypropylene (PP) and formed by a thermal lamination process.

Figure 1D:
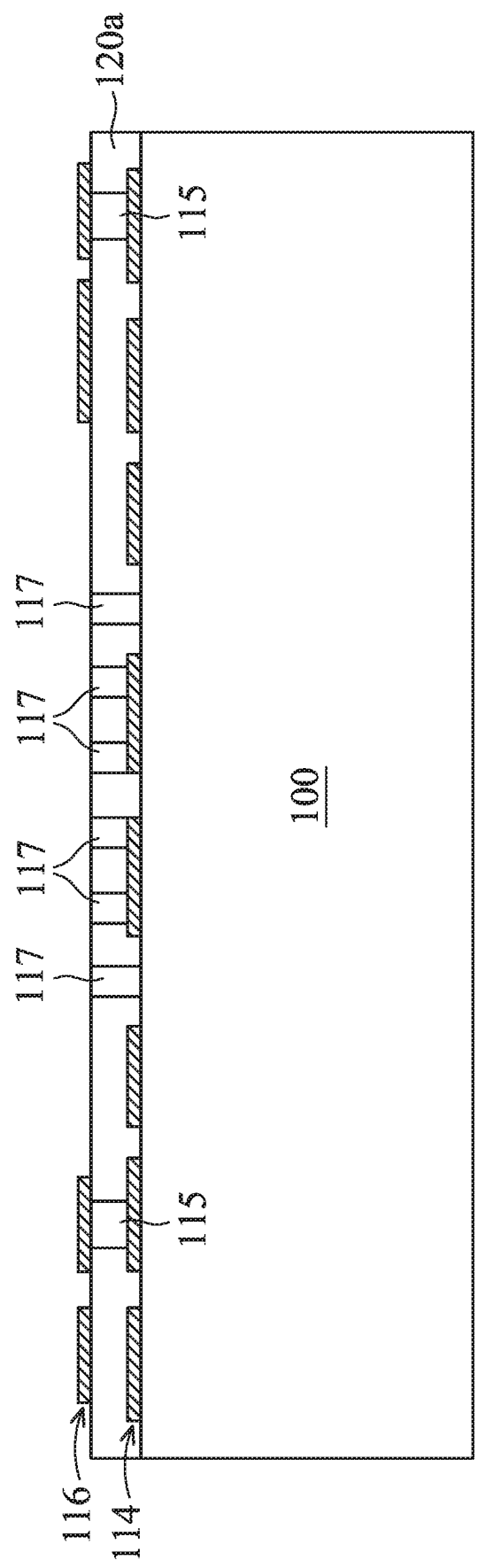

After the insulating layers 120a is formed, patterning and deposition processes is used to form conductive features 115 and 116 and thermal features 117, as shown in FIG. 1D in accordance with some embodiments. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof. The deposition process may include an electroplating process or an electroless process.

In some embodiments, the formed conductive features 115 include conductive vias for a subsequently formed RDL structure. The conductive vias provide electrical connection in vertical directions. In some embodiments, the material and formation method used for the formed conductive features 116 are the same as or similar to those of the conductive features 114.

Moreover, the conductive features 116 include conductive lines and also provide electrical connection in horizontal directions. In some embodiments, the thermal features 117 include thermal vias and are made of copper, gold, silver, or another suitable thermal conductive material. The thermal features 117 may be formed by deposition or coating processes, such as a spin coating process, an electroplating process, an electroless process, a CVD process, a PVD process, an atomic layer deposition (ALD) process, or one or more other applicable processes.

In some embodiments, the material used for the conductive features 115 and 116 is the same as that of the thermal features 117, and therefore the conductive features 115 and 116 and the thermal features 117 are formed by a common deposition process. In some other embodiments, the material used for the conductive features 115 and 116 is different than that of the thermal features 117, and therefore the conductive features 115 and 116 and the thermal features 117 are formed by respective deposition processes.

Figure 1E:
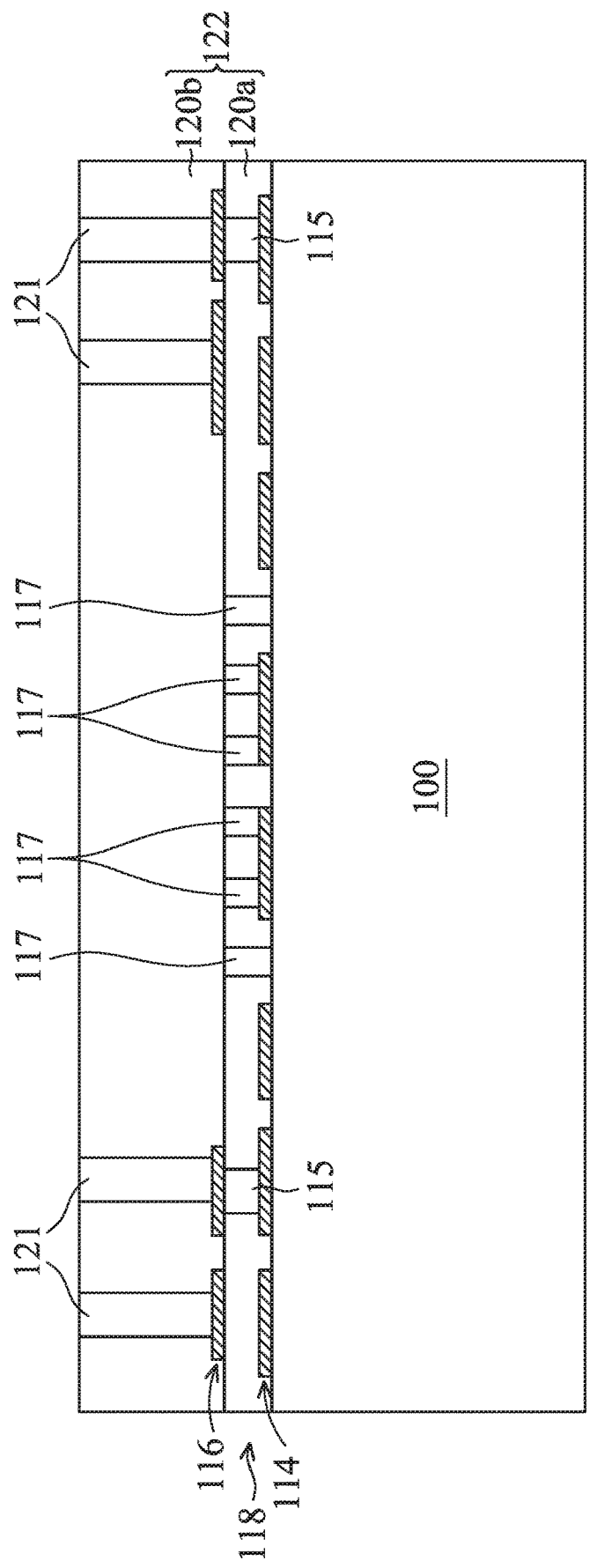

Afterwards, insulating layer 120b and conductive features 121 are subsequently formed over the structure shown in FIG. 1D, as shown in FIG. 1E in accordance with some embodiments. In some embodiments, the insulating layer 120b is formed over the insulating layer 120a and covers the top surfaces and sidewalls of the conductive features 116. In some embodiments, the material and formation method used for the insulating layer 120b are the same as or similar to those of the insulating layer 120a.

In some embodiments, the material and formation method used for the formed conductive features 115 are the same as or similar to those of the conductive features 121. Moreover, the conductive features 121 include conductive vias and also provide electrical connection in vertical directions. For example, the conductive features 121 are connected to the conductive features 116, so that the conductive features 121 are electrically connected to the conductive features 115 through the conductive features 116.

In some embodiments, some of the conductive vias are stacked on each other. The upper conductive via is substantially aligned with the lower conductive via. In some embodiments, some of the conductive vias are staggered vias. The upper conductive via is misaligned with the lower conductive via.

In some embodiments, the insulating layers 120a and 120b form a body of a package substrate 122. The package substrate 122 includes the conductive features 114, 115, 116 and 121 and thermal features 117 formed in the body (i.e., the insulating layers 120a and 120b) of the package substrate 122. The conductive features 114, 115, and 116 together form an RDL structure 118 in the package substrate 122.

After performing the deposition process used in the formation of the conductive features 121, a planarization processes may be used to provide the formed insulating layer 120b and the formed conductive features 121 with coplanar top surfaces to facilitate subsequent processes. The planarization processes may include a mechanical grinding process, a chemical mechanical polishing (CMP) process, a dry polishing process, one or more other applicable processes, or a combination thereof.

Figure 1F:
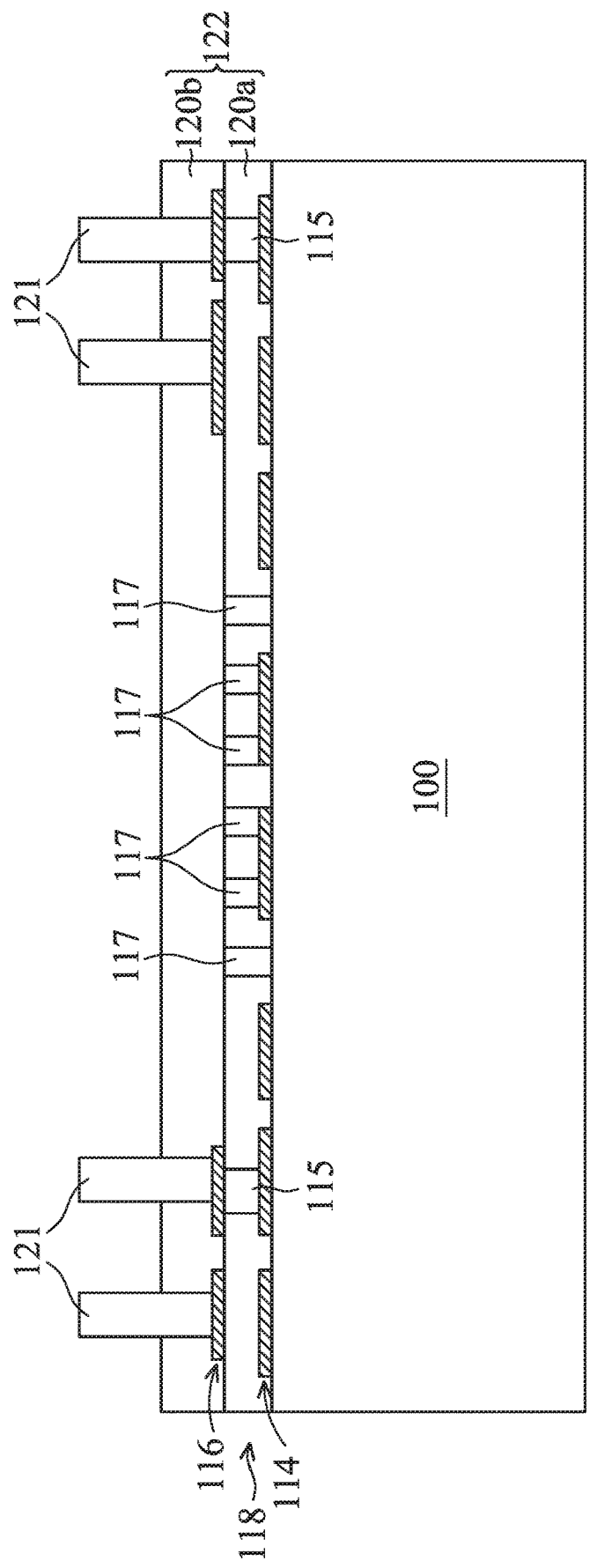

Afterwards, the insulating layer 120b is recessed, as shown in FIG. 1F in accordance with some embodiments. The top surface of the insulating layer 120b may be recessed by an etching back process, such as a dry etching process, so that the conductive features 121 are protruded from the top surface of the insulating layer 120b. The exposed portions of the conductive features 121 above the top surface of the insulating layer 120b serve as external electrical contacts for the RDL structure 118 in the package substrate 122.

Figure 1G:
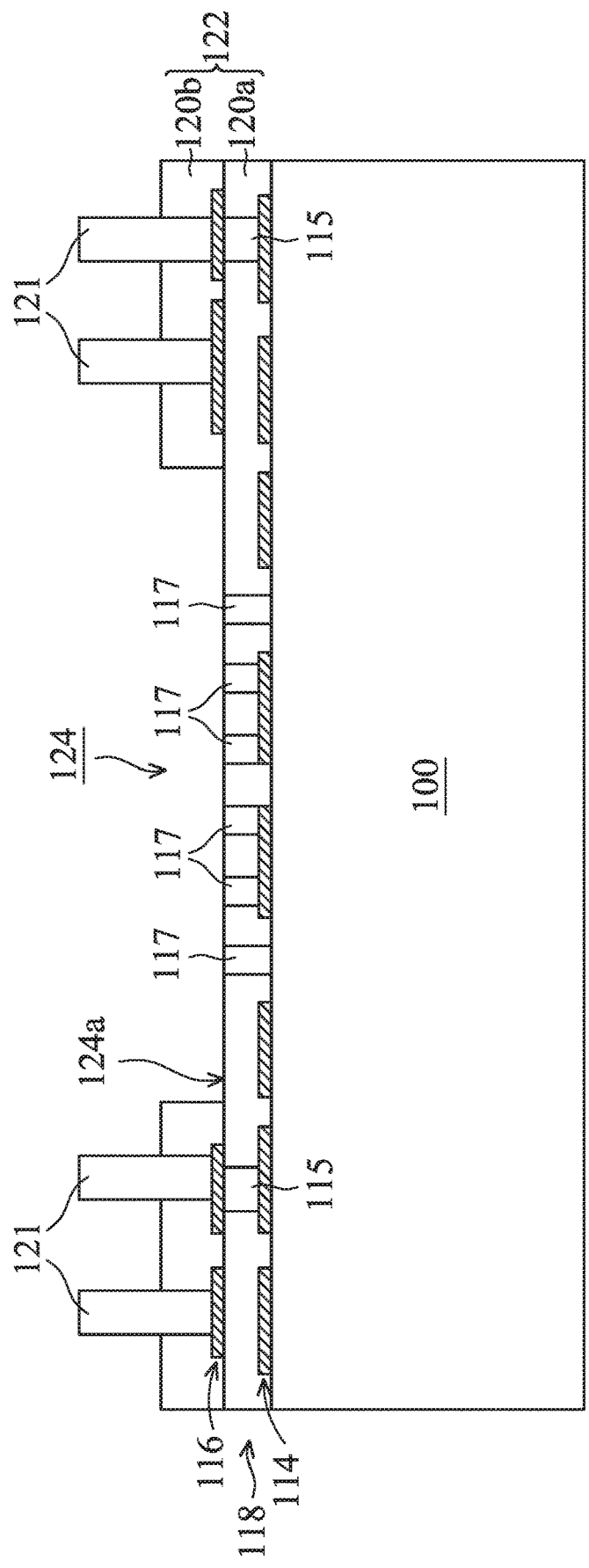

After the insulating layer 120b is recessed, a cavity 124 is formed in the body of the package substrate, as shown in FIG. 1G in accordance with some embodiments. In some embodiments, the cavity 124 is formed in the insulating layer 120b and exposes the top surfaces of the insulating layer 120a and the thermal features 117. In those cases, the exposed top surface of the insulating layer 120a forms the bottom surface 124a of the cavity 124 and substantially level with the top surfaces of the thermal features 117.

In some other embodiments, the bottom surface 124a of the cavity 124 extends into the insulating layer 120a. In those cases, the thermal features 117 are also partially etched, so that the top surfaces of the thermal features 117 are substantially coplanar with the bottom surface 124a of the cavity 124.

After the cavity 124 is formed, the package substrate 122 including the RDL structure 118, the thermal features 117, the conductive features 121, and the cavity 124 is obtained.

Although the package substrate 122 shown in FIG. 1G includes the conductive features 121 protruded from the top surface of the insulating layer 120b, embodiments of the disclosure are not limited thereto. Many variations and/or modifications can be made to embodiments of the disclosure.

Figure 2:
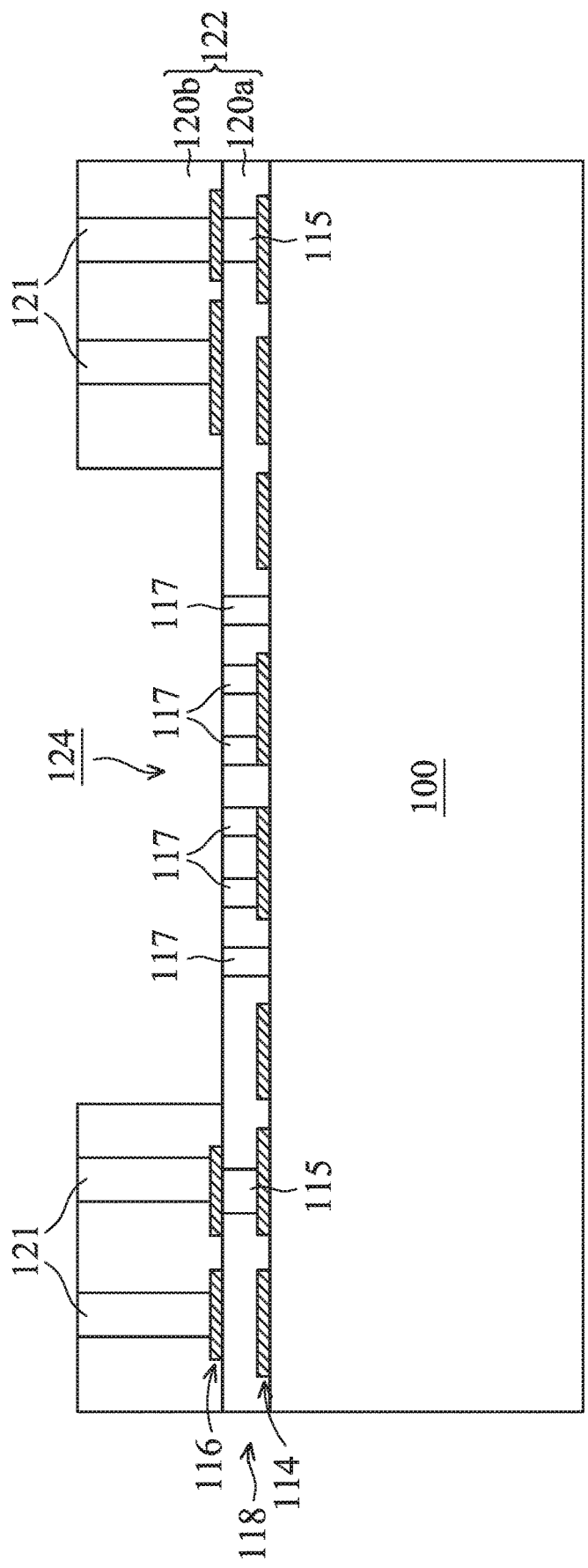
FIG. 2 illustrates a cross-sectional representation of a package substrate with a cavity for a package structure in accordance with some embodiments.

FIG. 2 illustrates a cross-sectional representation of a package substrate with a cavity for a package structure in accordance with some embodiments. The package substrate 122 shown in FIG. 2 is similar to the package substrate 122 shown in FIG. 1G, except that the conductive features 121 in the package substrate 122 shown in FIG. 2 are not protruded from the top surface of the insulating layer 120b. More specifically, the package substrate 122 shown in FIG. 2 may be formed by a method that is similar to that used in the package substrate 122 shown in FIG. 1G. However, the insulating layer 120b is not recessed after the planarization processes is performed to provide the formed insulating layer 120b and the formed conductive features 121 with coplanar top surfaces and before the formation of the cavity 124. Therefore, the insulating layer 120b in FIG. 2 has a top surface that is substantially level with the top surfaces of the conductive features 121.

Although the package substrate 122 shown in FIG. 1G includes the cavity 124 exposing the thermal features 117, embodiments of the disclosure are not limited thereto. Many variations and/or modifications can be made to embodiments of the disclosure.

Figure 3:
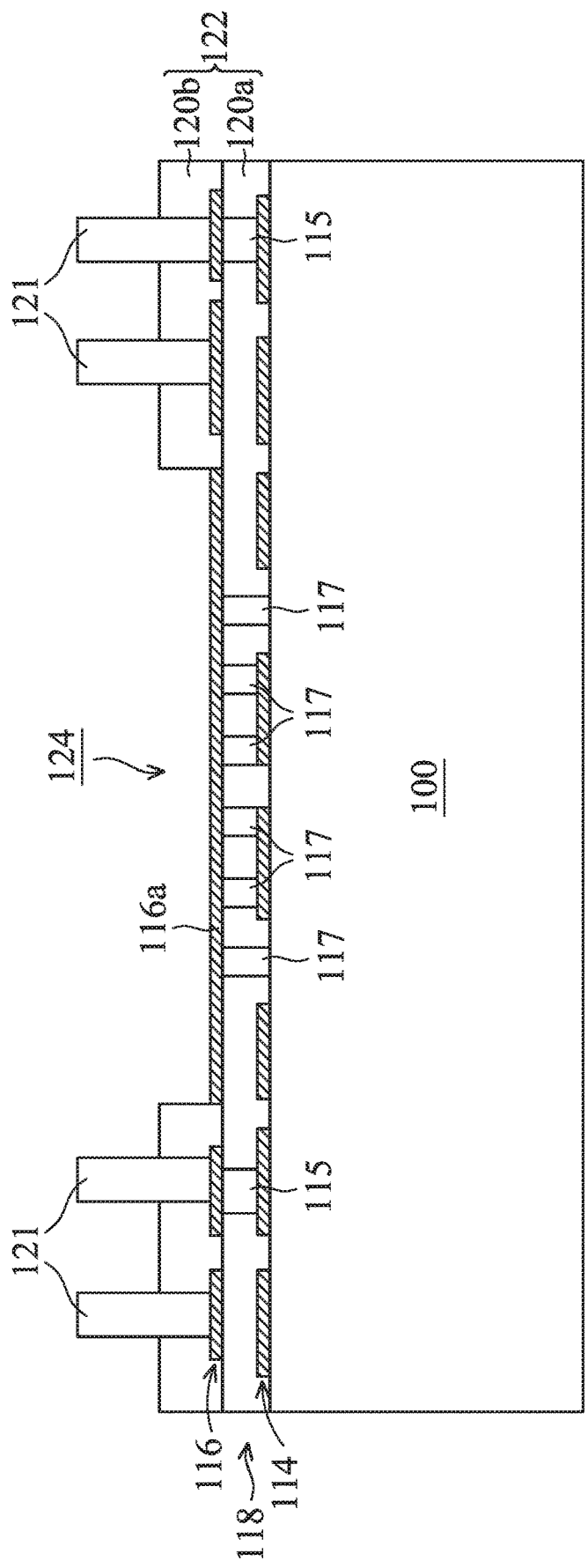
FIG. 3 illustrates a cross-sectional representation of a package substrate with a cavity for a package structure in accordance with some embodiments.

FIG. 3 illustrates a cross-sectional representation of a package substrate with a cavity for a package structure in accordance with some embodiments. The package substrate 122 shown in FIG. 3 is similar to the package substrate 122 shown in FIG. 1G, except that the cavity 124 in the package substrate 122 shown in FIG. 3 does not expose the thermal features 117. More specifically, the package substrate 122 shown in FIG. 3 may be formed by a method that is similar to that used in the package substrate 122 shown in FIG. 1G.

However, during the formation of the conductive features 115 and 116 and the thermal features 117, a thermal conductive layer 116a is formed over and extended from the top surfaces of the thermal features 117, so that the subsequently formed cavity 124 exposes the thermal conductive layer 116a. Therefore, the thermal features 117 below the cavity 124 are covered by the thermal conductive layer 116a.

In some embodiments, the material used for the conductive features 115 and 116 is the same as that of the thermal features 117 and the thermal conductive layer 116a, and therefore the conductive features 115 and 116, the thermal features 117, and the thermal conductive layer 116a are formed by a common deposition process.

In some other embodiments, the material used for the conductive features 115 and 116 is different than that of the thermal features 117 and thermal conductive layer 116a, and therefore the conductive features 115 and 116 are formed by a common deposition process, and the thermal features 117 and thermal conductive layer 116a are formed by another common deposition process.

Although the package substrate 122 shown in FIG. 2 includes the cavity 124 exposing the thermal features 117, embodiments of the disclosure are not limited thereto. Many variations and/or modifications can be made to embodiments of the disclosure.

Figure 4:
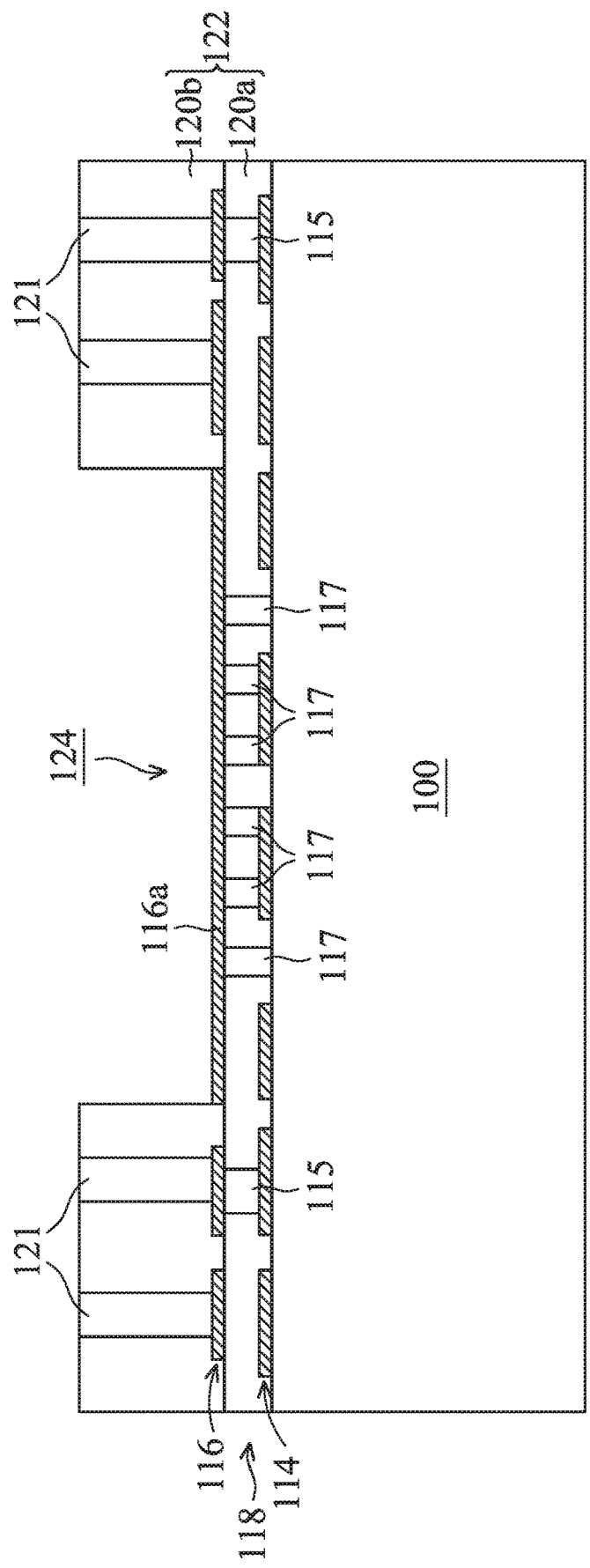
FIG. 4 illustrates a cross-sectional representation of a package substrate with a cavity for a package structure in accordance with some embodiments.

FIG. 4 illustrates a cross-sectional representation of a package substrate with a cavity for a package structure in accordance with some embodiments. The package substrate 122 shown in FIG. 4 is similar to the package substrate 122 shown in FIG. 2, except that the cavity 124 in the package substrate 122 shown in FIG. 2 does not expose the thermal features 117. More specifically, the package substrate 122 shown in FIG. 4 may be formed by a method that is similar to that used in the package substrate 122 shown in FIG. 2.

However, during the formation of the conductive features 115 and 116 and the thermal features 117, a thermal conductive layer 116a is formed over and extended from the top surfaces of the thermal features 117, so that the subsequently formed cavity 124 exposes the thermal conductive layer 116a. Therefore, the thermal features 117 below the cavity 124 are covered by the thermal conductive layer 116a.

In some embodiments, the material used for the conductive features 115 and 116 is the same as that of the thermal features 117 and the thermal conductive layer 116a, and therefore the conductive features 115 and 116, the thermal features 117, and the thermal conductive layer 116a are formed by a common deposition process.

In some other embodiments, the material used for the conductive features 115 and 116 is different than that of the thermal features 117 and thermal conductive layer 116a, and therefore the conductive features 115 and 116 are formed by a common deposition process, and the thermal features 117 and thermal conductive layer 116a are formed by another common deposition process.

Figure 5A:
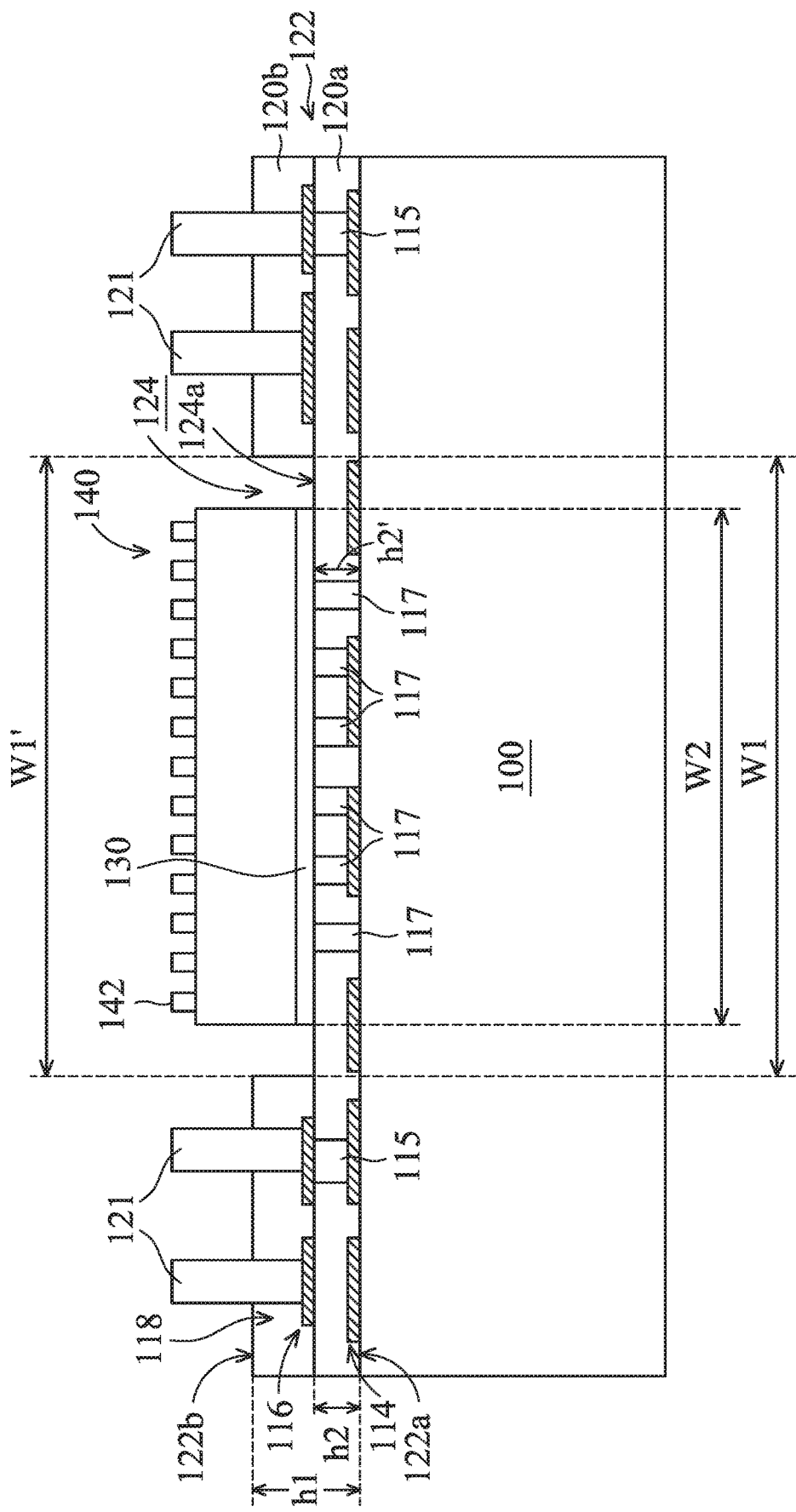
FIGS. 5A to 5G illustrate perspective views of various stages of manufacturing a package structure in accordance with some embodiments.

FIGS. 5A to 5G illustrate perspective views of various stages of manufacturing a package structure 10 in accordance with some embodiments. In some embodiments, the package structure 10 is manufactured using a wafer-level package process. However, in order to simplify the diagrams, only a package unit region is depicted. A package substrate 122 formed on a carrier substrate 100 as shown in FIG. 1G is provided and one or more electronic devices are formed in the cavity 124, as shown in FIG. 5A in accordance with some embodiments. More specifically, the package substrate 122 has a first surface 122a (e.g., a bottom surface) and a second surface 122b (e.g., a top surface) opposite the first surface 122a. The package substrate 122 also includes a cavity 124 extending from the second surface 122b of the package substrate 122 toward the first surface 122a of the package substrate 122, and thermal features 117 extending from the bottom surface 124a of the cavity 124 to the first surface 122a of the package substrate 122.

Afterward, one or more electronic devices are provided and placed in the cavity 124 of the package substrate 122, so as to be thermally coupled to the thermal features 117, in accordance with some embodiments. For example, an electronic device 140 may be formed in the cavity 124 of the package substrate 122 and protruded above the cavity 124.

In some embodiments, the electronic device 140 includes a semiconductor die (e.g., SoC die), a chiplet, an active device (e.g., transistor or diode), or a passive device (e.g., capacitor, inductor, or resistor). For an example, the electronic device 140 may be a semiconductor die including application processors, power management integrated circuits, memory devices, one or more other suitable circuits, or a combination thereof. The semiconductor die has an active surface (e.g., a front surface) and a non-active surface (e.g., a rear surface).

Conductive connectors 142, such as conductive pillars, Cu/Sn microbumps, pre-solders, one or more other suitable bonding structures, or a combination thereof, is formed over the active surface of the semiconductor die. The non-active surface of the semiconductor die may be bonded onto the bottom surface 124a of the cavity 124 via an adhesive layer 130 (such as a die attach film (DAF)) using a pick and place process. As a result, the heat generated from the semiconductor die can be dissipated by the thermal features 117.

In some embodiments, in the package substrate 122, the distance between the first surface 122a of the package substrate 122 and the second surface 122b of the package substrate 122 is defined as the thickness h1 of the package substrate 122. Namely, the sum of the thicknesses of the insulating layer 120a and the insulating layer 120b is equal to the thickness h1 of the package substrate 122. A portion of the package substrate 122 directly below the cavity 124 has a thickness h2, and therefore the depth of the cavity 124 is equal to the thickness difference between the thickness h1 and the thickness h2 (i.e., h1−h2). In an example, the thickness h2 is equal to the thickness of the insulating layer 120a. In some embodiments, the thickness h1 is in a range from about 60 μm and about 400 μm. Moreover, the ratio of the thickness h2 to the thickness h1 (i.e., h2/h1) is greater than zero and less than 1 (i.e., 0<h2/h1<1).

In some embodiments, in the package substrate 122, the cavity 124 has vertical sidewalls, so that the top width W1' of the cavity 124 is equal to the bottom width W1 of the cavity 124. Alternatively, the cavity 124 has tilted sidewalls, so that the cavity 124 has an inverted trapezoid shape. The top width W1' is equal to the sum of the bottom width W1 and two times of the depth of the cavity 124 (i.e., W1'=W1+ 2(h1−h2)). In other words, when the depth of the cavity 124 is increased by 1 μm, the top width W1' of the cavity 124 is increased by 2 μm.

Moreover, the cavity 124 has a width ratio of the top width W1' to the bottom width W1 (e.g., W1'/W1), and this ratio (W1'/W1) is in a range from about 1 and about 2 (i.e., 1≤W1'/W1≤2). Accordingly, the tilted angle of the sidewall of the cavity 124 is in a range from about 45° (i.e., W1'/W1=2) and about 90° (i.e., W1'/W1=1). In some embodiments, the electronic device 140 (e.g., the semiconductor die) has a width W2 that is less than the top width W1' and the bottom width W1 of the cavity 124 (i.e., W2<W1' and W2<W1).

In some embodiments, in the package substrate 122, the thermal feature 117 has a height h2', and the ratio of the height h2' to the thickness h2 (which is the thickness of the portion of the package substrate 122 directly below the cavity 124) is greater than zero and equal to or less than 1 (i.e., 0<h2'/h2≤1). For example, some of the thermal features 117 extend from the bottom surface 124a of the cavity 124 to the first surface 122a of the package substrate 122, so that the ratio (h2'/h2) is equal to 1. Some other thermal features 117 extend from the bottom surface 124a of the cavity 124 to the conductive feature 114 that is formed directly below the cavity 124, the ratio (h2'/h2) is less than 1. In some embodiments, those thermal features 117 are arranged in an array and formed directly below the cavity 124.

Figure 5B:
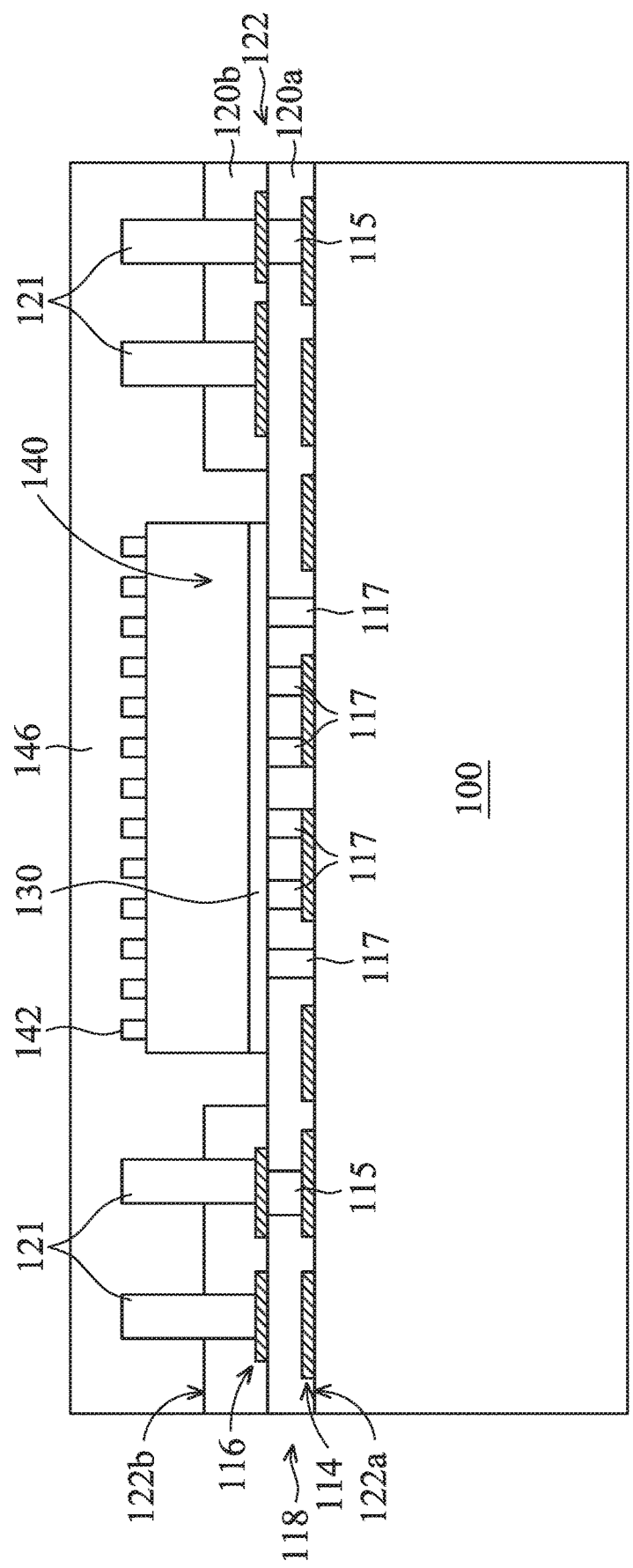

After the electronic device 140 is formed in the cavity 124 of the package substrate 122, an encapsulating material 146 is formed, as shown in FIG. 5B in accordance with some embodiments. More specifically, the encapsulating material 146 is formed in the cavity 124, so that the encapsulating material 146 extends along sidewalls of the electronic device 140 and covers the surface of the electronic device 140 opposite the bottom surface 124a of the cavity 124. Moreover, the formed encapsulating material 146 extends on the second surface 122b of the package substrate 122 and covers the portion of each conductive feature 121 protruded from the insulating layer 120b and the conductive connectors 142. In some embodiments, the encapsulating material 146 includes a molding compound material. The molding compound material may be a polymer material, such as an epoxy-based resin, an underfill material, or the like. For example, the encapsulating material 146 includes a liquid molding material that is introduced or injected onto the package substrate 122. Afterwards, a thermal process is then used to cure the liquid molding material to form the encapsulating material 146. In some embodiments, the polymer (not shown) is formed around the conductive connectors 142 with coplanar top surfaces for the following process alignment.

Figure 5C:
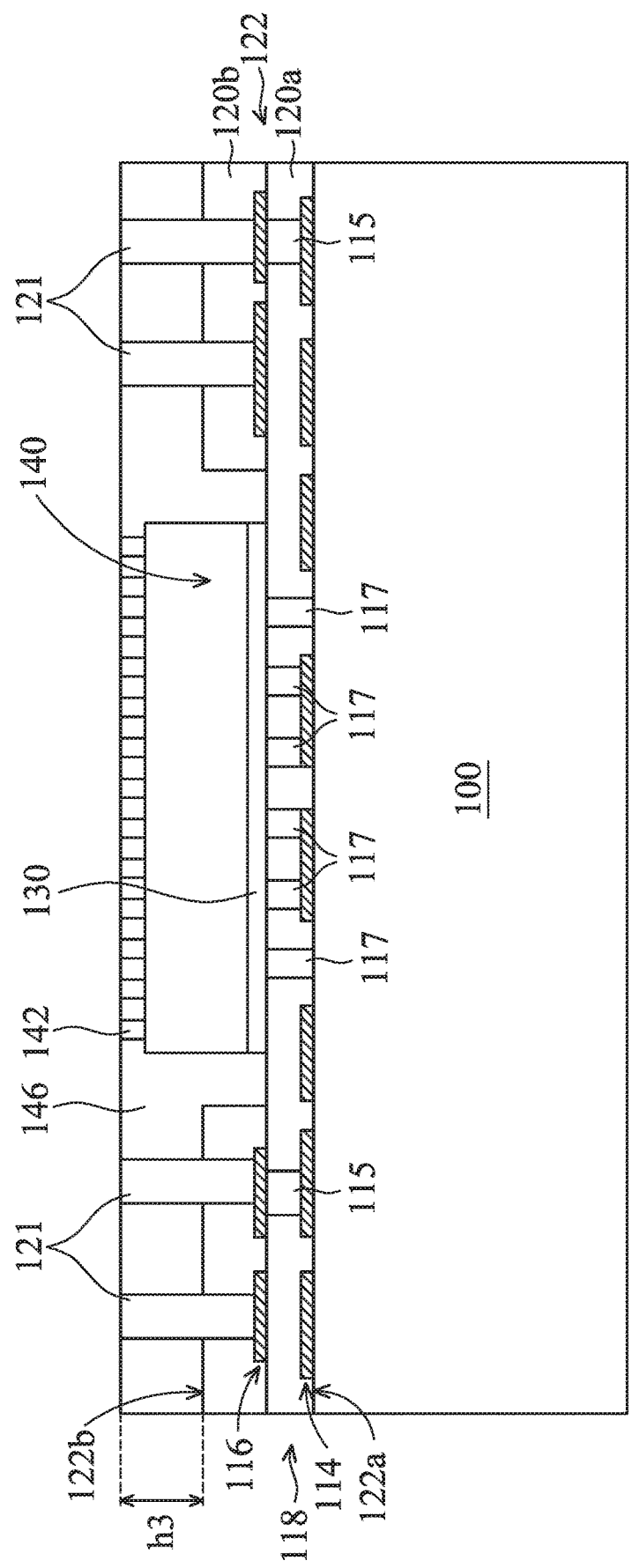

Afterwards, a planarization process is performed on the encapsulating material 146, as shown in FIG. 5C in accordance with some embodiments. In some embodiments, the conductive features 121 and the conductive connectors 142 are exposed from the encapsulating material 146 after the planarization process. The planarization process provides the remaining encapsulating material 146, the conductive features 121, and the conductive connectors 142 with coplanar top surfaces to facilitate subsequent processes. The planarization processes may include a mechanical grinding process, a chemical mechanical polishing (CMP) process, a dry polishing process, one or more other applicable processes, or a combination thereof. In some embodiments, the conductive features 121 formed in the remaining encapsulating material 146 has a height h3 that is in a range from about 5 μm and about 100 μm. In some other embodiments, the height h3 is equal to or less than the thickness h1, and the thickness h1 is substantially equal to 200 μm.

Figure 5D:
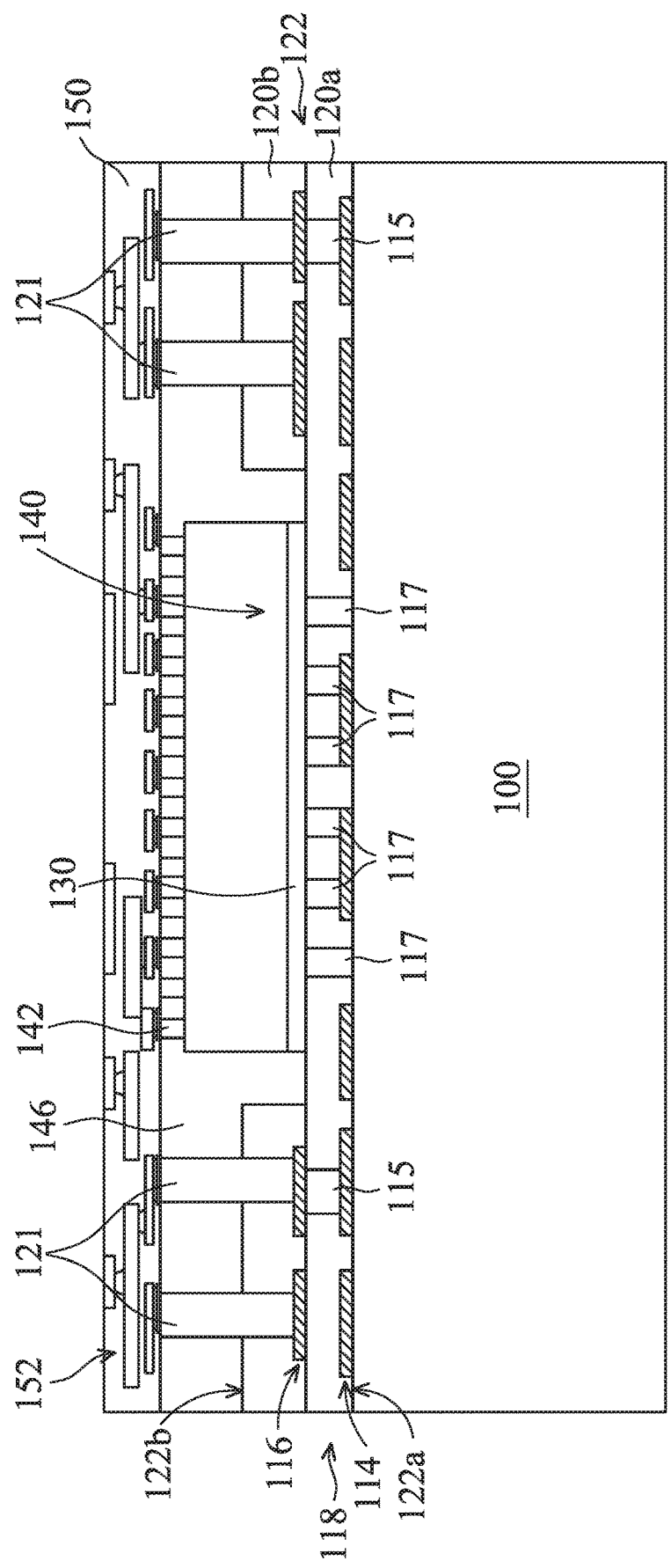

After the planarization process, an insulating layer 150 with an RDL structure 152 is formed over the encapsulating material 146, as shown in FIG. 5D in accordance with some embodiments. More specifically, the insulating layer 150 with an RDL structure 152 is in direct contact with the encapsulating material 146, so that the RDL structure 152 is electrically connected to the electronic device 140 via the conductive connectors 142. Moreover, the bottom surface of the insulating layer 150 is separated from the package substrate 122 by the encapsulating material 146. In addition, the RDL structure 152 is also electrically connected to the RDL structure 118 via the conductive features 121.

Similar to the RDL structure 118, the RDL structure 152 is used for routing, which enables the formation of a package structure with fan-out features. In some embodiments, the RDL structure 152 includes multiple conductive features such as conductive lines, conductive vias, and/or conductive pads formed in and/or on the insulating layer 150.

The material and the method used in the RDL structure 152 may be the same as or similar to those used in the RDL structure 118. Since the RDL structure 118 formed in the package substrate 122 can enable the subsequently formed package structure with fan-out features, the number of the level of the conductive lines in the insulating layer 150 can be reduced, thereby reducing the thickness of the insulating layer 150, while maintaining high input/output density of the RDL structure 152. Moreover, since the number of the level of the conductive lines in the insulating layer 150 can be reduced, the parasitic resistance can be reduced and more electronic devices can be integrated into the subsequently formed package structure 10.

The insulating layer 150 may be made of or include one or more dielectric materials. The dielectric material may include Polyimide (PI), silicon oxide, silicon carbide, silicon nitride, silicon oxynitride, one or more other suitable materials, or a combination thereof. Moreover, the insulating layer 150 may be formed by deposition or coating processes, such as a spin coating process, a CVD process, a PVD process, an ALD process, or one or more other applicable processes.

Figure 5E:
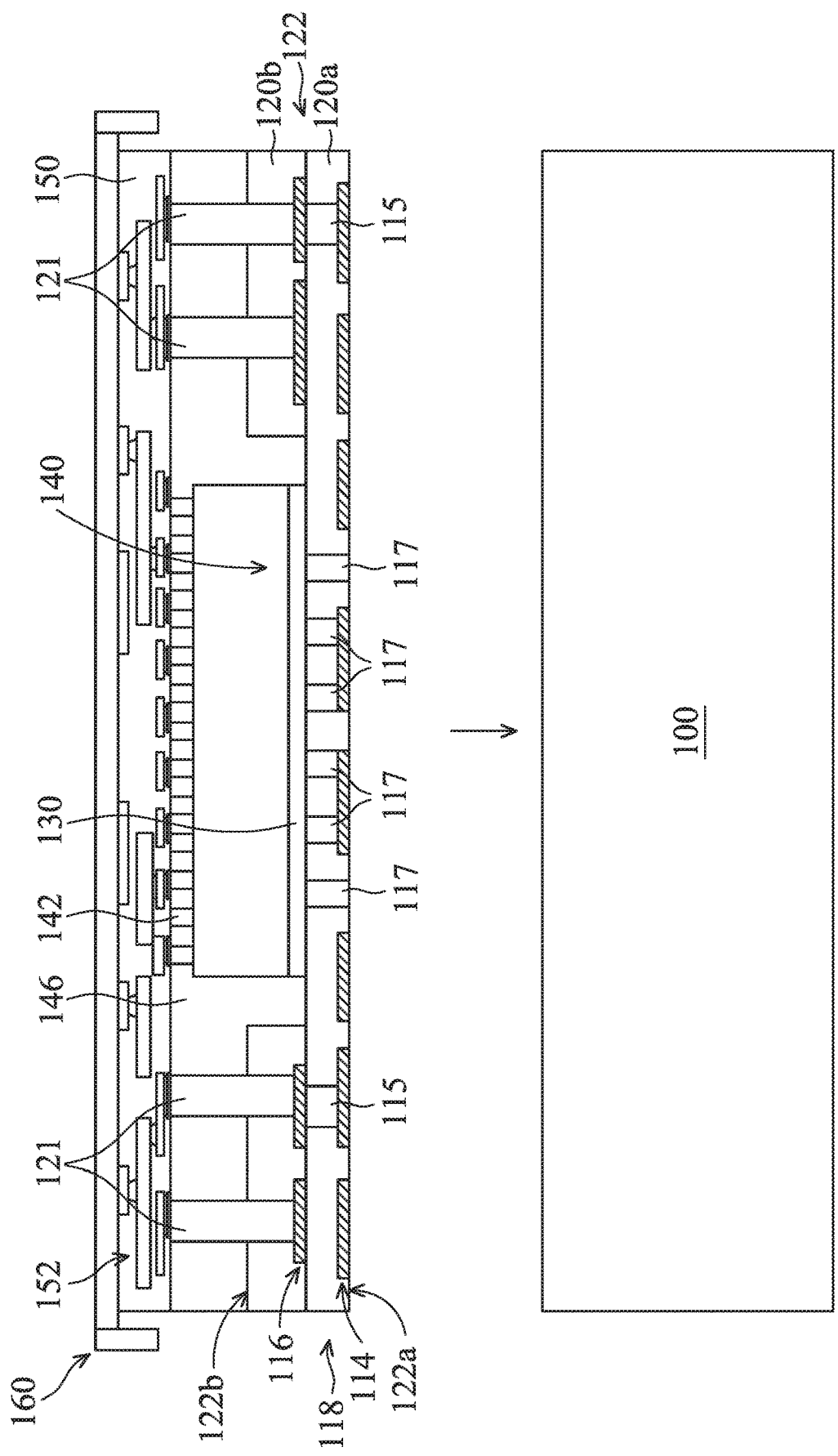
Figure 5F:
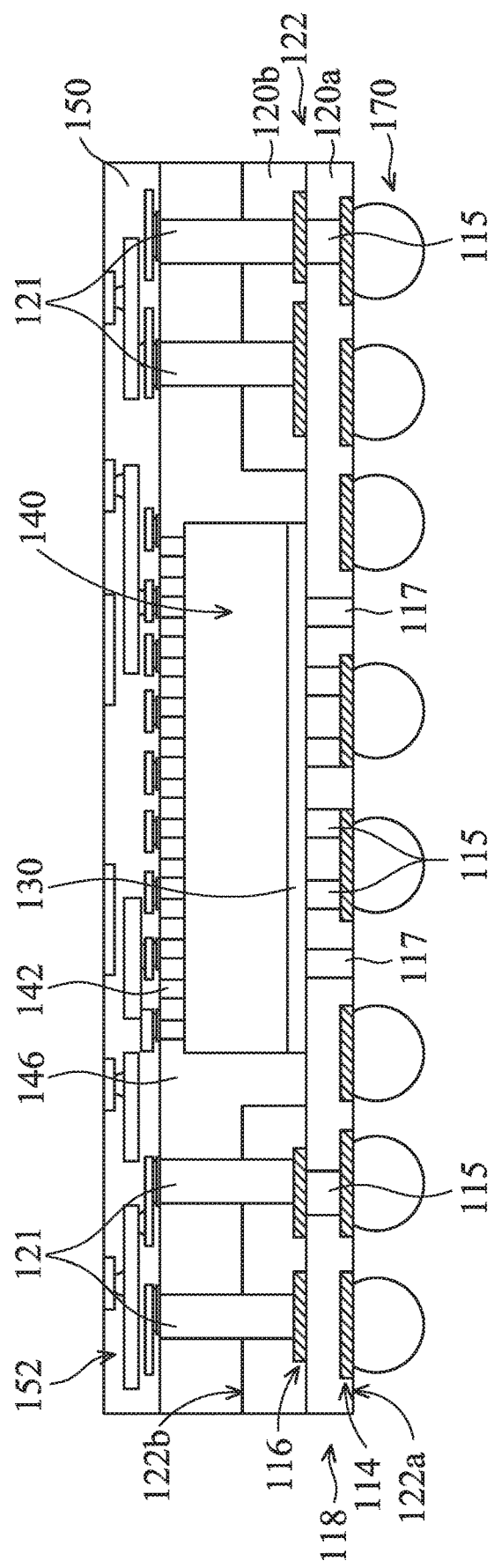

After the insulating layer 150 with the RDL structure 152 is formed, the carrier substrate 100 is removed from the first surface 122a of the package substrate 122 and conductive connectors 170 are formed over the first surface 122a of the package substrate 122, as shown in FIGS. 5E to 5F in accordance with some embodiments.

More specifically, the top surface of the insulating layer 150 is attached to a frame carrier 160, in accordance with some embodiments.

Afterwards, the carrier substrate 100 is removed from the first surface 122a of the package substrate 122 by a debonding process, as shown in FIG. 5E in accordance with some embodiments. As a result, the first surface 122a of the package substrate 122 is exposed. In some embodiments, a clean process, such as a dry etching process is performed to remove the residues (which may be formed after the debonding process) on the first surface 122a of the package substrate 122.

Afterwards, the conductive connectors 170 are formed over the exposed first surface 122a of the package substrate 122 and electrically connected to the conductive features 114 of the RDL structure 118. In some embodiments, the conductive connectors 170 include conductive pillars, conductive bumps, the like, or a combination thereof.

Afterwards, a sawing process is performed to cut the package substrate 122, the encapsulating material 146, and the insulating layer 150 along the edge of the package unit region (not shown), in accordance with some embodiments. The frame carrier 160 is removed from the top surface of the insulating layer 150 after the sawing process, in accordance with some embodiments. The resulting structure is shown in FIG. 5F.

Figure 5G:
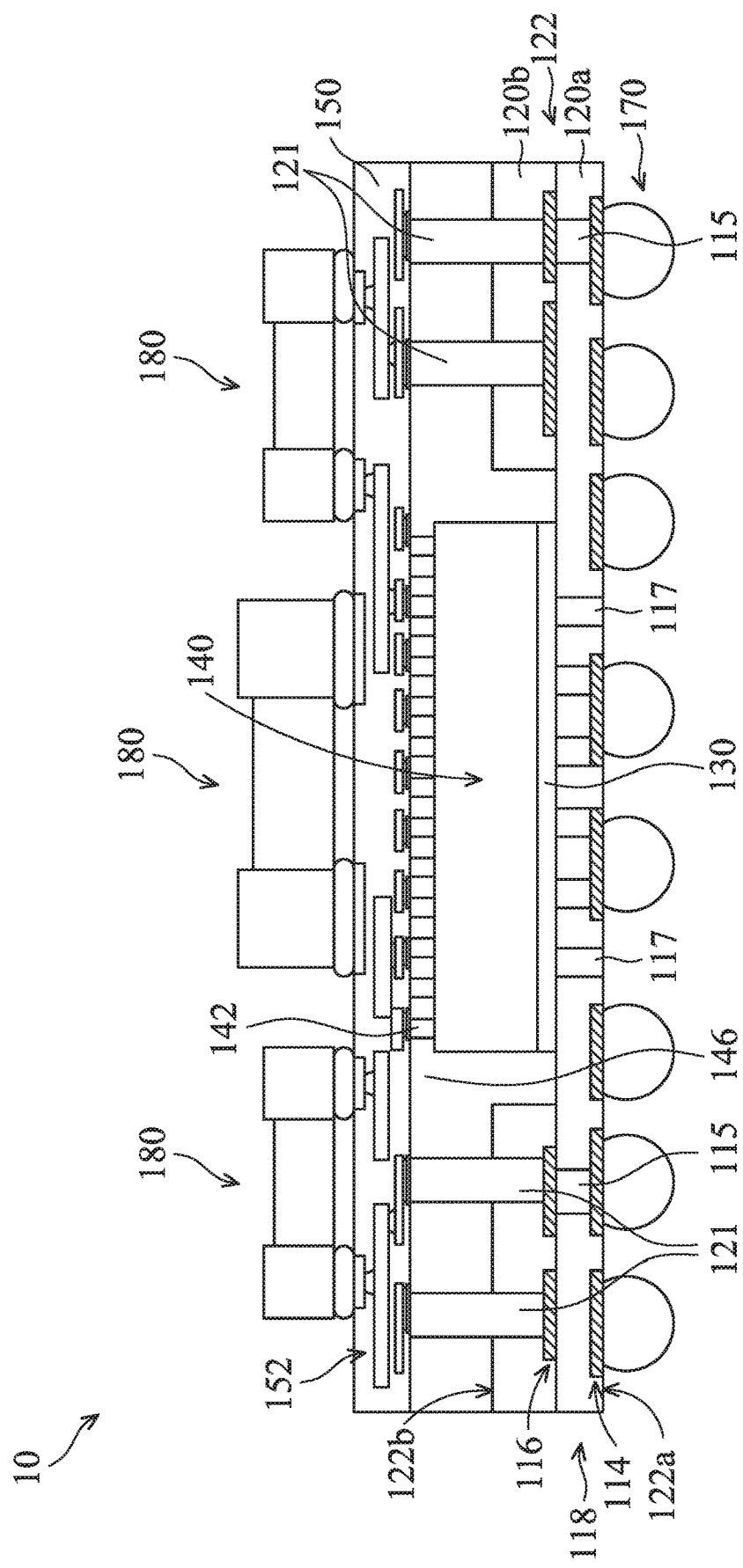

After the removal of the frame carrier 160, one or more electronic devices 180 are formed over the insulating layer 150 to achieve a package structure 10, as shown in FIG. 5G in accordance with some embodiments. In some embodiments, electronic devices 180 are formed over the insulating layer 150 and electrically connected to the RDL structure 152, so that the electronic device 140 and the electronic devices 180 are located at two opposite sides of the insulating layer 150. In some embodiments, the electronic devices 180 include semiconductor dies (e.g., SoC dies), chiplets, active devices (e.g., transistors or diodes), or passive device (e.g., capacitors, inductors, or resistors). For an example, the electronic devices 180 may be capacitors, such as multilayer ceramic capacitors (MLCCs). In some embodiments, an encapsulation layer (not shown) is optionally formed over the insulating layer 150 to cover and protect the electronic devices 180 in package structure 10.

Although the package structure 10 shown in FIG. 5G includes the conductive features 121 protruded from the second surface 122b of the package substrate 122, embodiments of the disclosure are not limited thereto. Many variations and/or modifications can be made to embodiments of the disclosure.

Figure 6:
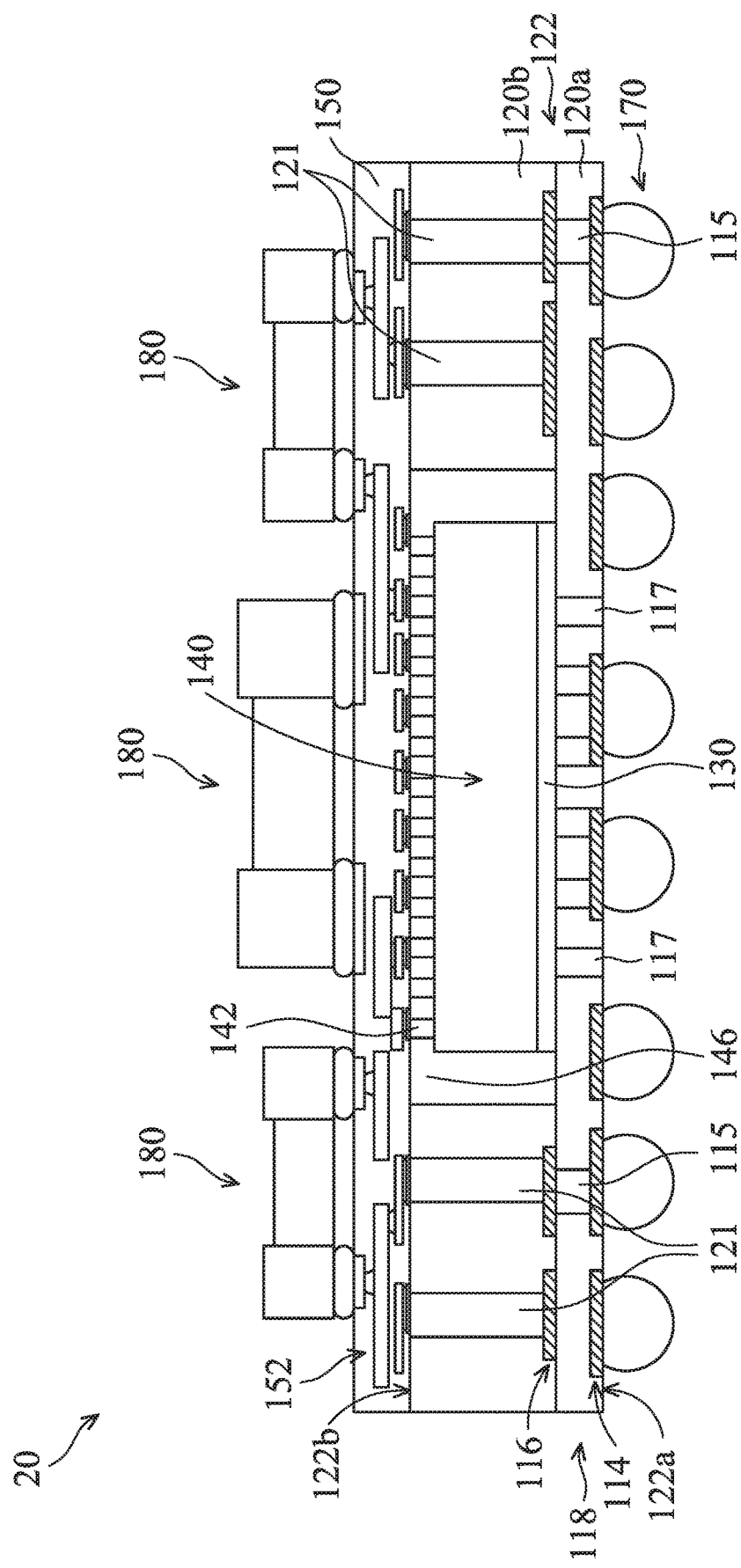
FIG. 6 illustrates a cross-sectional representation of a package structure in accordance with some embodiments.

FIG. 6 illustrates a cross-sectional representation of a package structure 20 in accordance with some embodiments. The package structure 20 shown in FIG. 6 is similar to the package structure 10 shown in FIG. 5G, except that the conductive features 121 in the package substrate 122 shown in FIG. 6 are not protruded from the second surface 122b of the package substrate 122. In some embodiments, an encapsulation layer (not shown) is optionally formed over the insulating layer 150 to cover and protect the electronic devices 180 in package structure 20.

More specifically, the package structure 20 shown in FIG. 6 may be formed by a method that is similar to that used in the package structure 10 shown in FIG. 5G. However, the insulating layer 120b is not recessed after the planarization processes is performed to provide the formed insulating layer 120b and the formed conductive features 121 with coplanar top surfaces and before the formation of the cavity 124. Moreover, another planarization process is performed after the encapsulating material 146 is filled in the cavity 124. As a result, the insulating layer 120b in FIG. 6 has a top surface that is substantially level with the top surfaces of the conductive features 121, the encapsulating material 146, and the conductive connectors 142. Therefore, the subsequently formed insulating layer 150 is in direct contact with the second surface 122b of the package substrate 122 and the top surface of the encapsulating material 146 formed in the cavity 124. In other words, interfaces formed between the insulating layer 150 and the package substrate 122 and between the insulating layer 150 and the encapsulating material 146 form a heterogeneous interface.

Although the package structure 10 shown in FIG. 5G includes the cavity 124 exposing the thermal features 117, embodiments of the disclosure are not limited thereto. Many variations and/or modifications can be made to embodiments of the disclosure.

Figure 7:
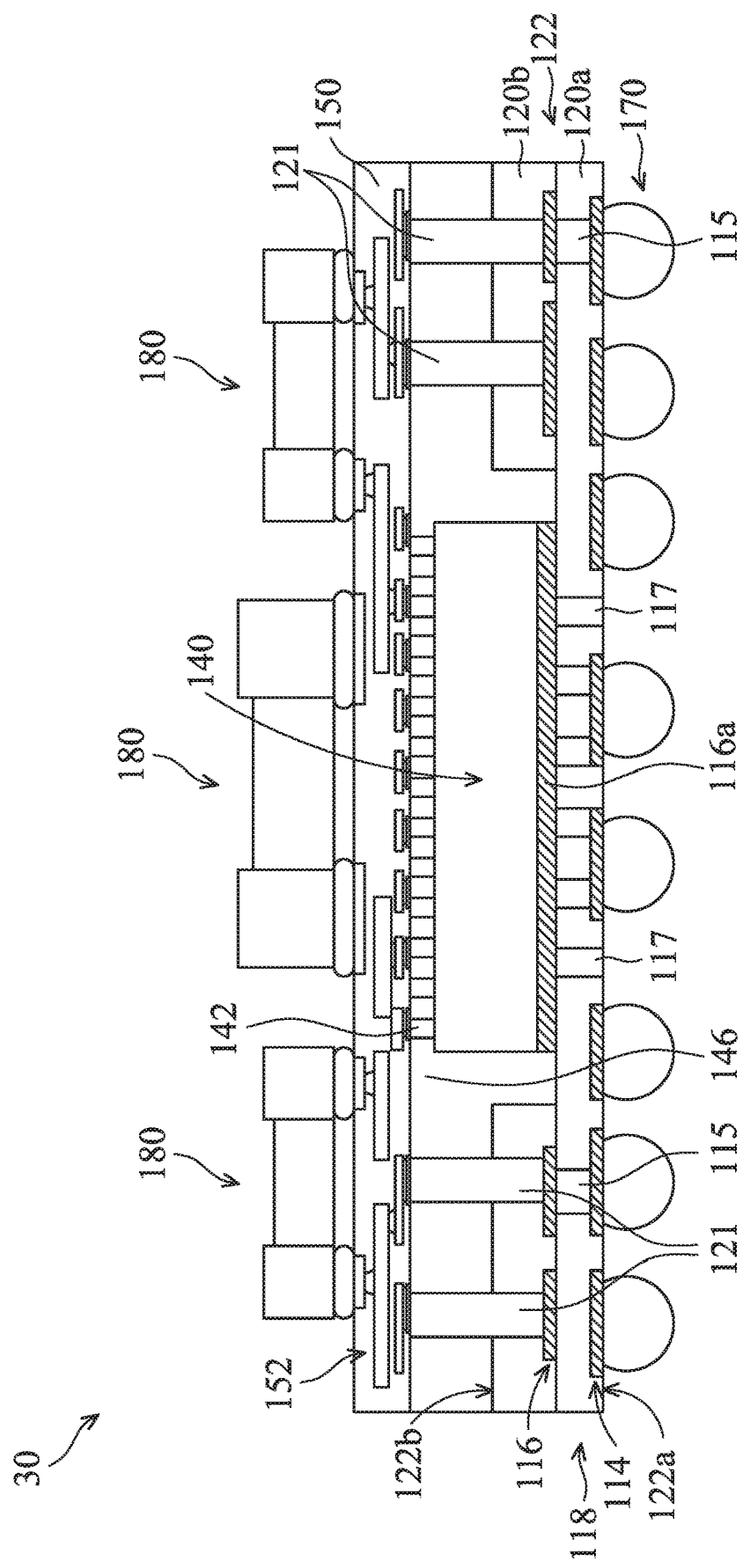
FIG. 7 illustrates a cross-sectional representation of a package structure in accordance with some embodiments.
Figure 8:
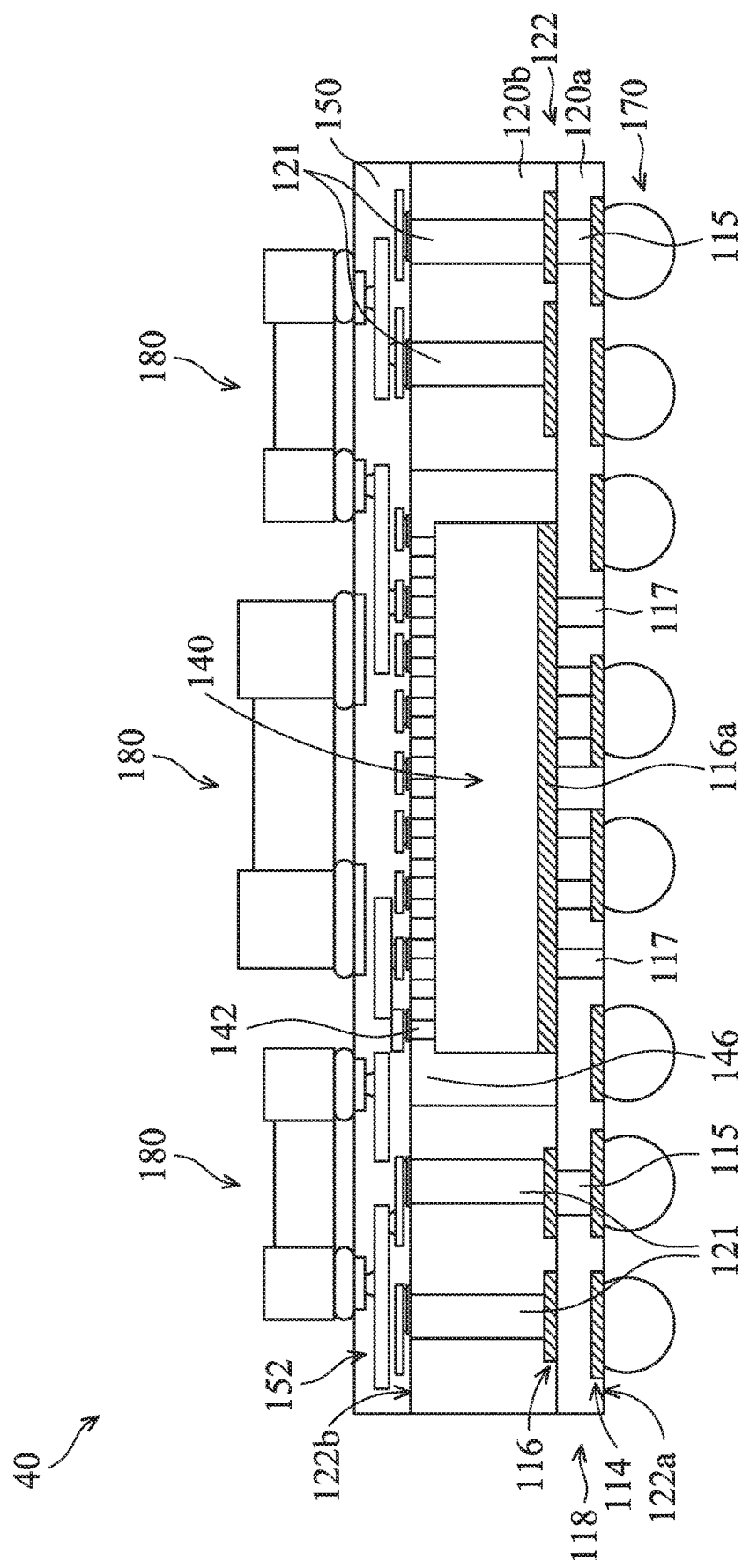
FIG. 8 illustrates a cross-sectional representation of a package structure in accordance with some embodiments.

FIG. 7 illustrates a cross-sectional representation of a package structure 30 in accordance with some embodiments and FIG. 8 illustrates a cross-sectional representation of a package structure 40 in accordance with some embodiments. The package structure 30 shown in FIG. 7 is similar to the package structure 10 shown in FIG. 5G and the package structure 40 shown in FIG. 8 is similar to the package structure 20 shown in FIG. 6, except that the cavity 124 in the package structures 30 and 40 does not expose the thermal features 117. In some embodiments, an encapsulation layer (not shown) is optionally formed over the insulating layer 150 to cover and protect the electronic devices 180 in both package structures 30 and 40.

More specifically, the package structure 30 may be formed by a method that is similar to that used in the package structure 10 shown in FIG. 5G, and the package structure 40 may be formed by a method that is similar to that used in the package structure 20 shown in FIG. 6. However, during the formation of the conductive features 115 and 116 and the thermal features 117, a thermal conductive layer 116a is formed over and extended from the top surfaces of the thermal features 117, so that the subsequently formed cavity 124 exposes the thermal conductive layer 116a. Therefore, the thermal features 117 below the cavity 124 are covered by the thermal conductive layer 116a.

Although the package structure 10 shown in FIG. 5G includes electronic devices 180 and conductive connectors 170 formed over the insulating layer 150 and the first surface 122a of the package substrate 122, respectively, embodiments of the disclosure are not limited thereto. Many variations and/or modifications can be made to embodiments of the disclosure.

Figure 9:
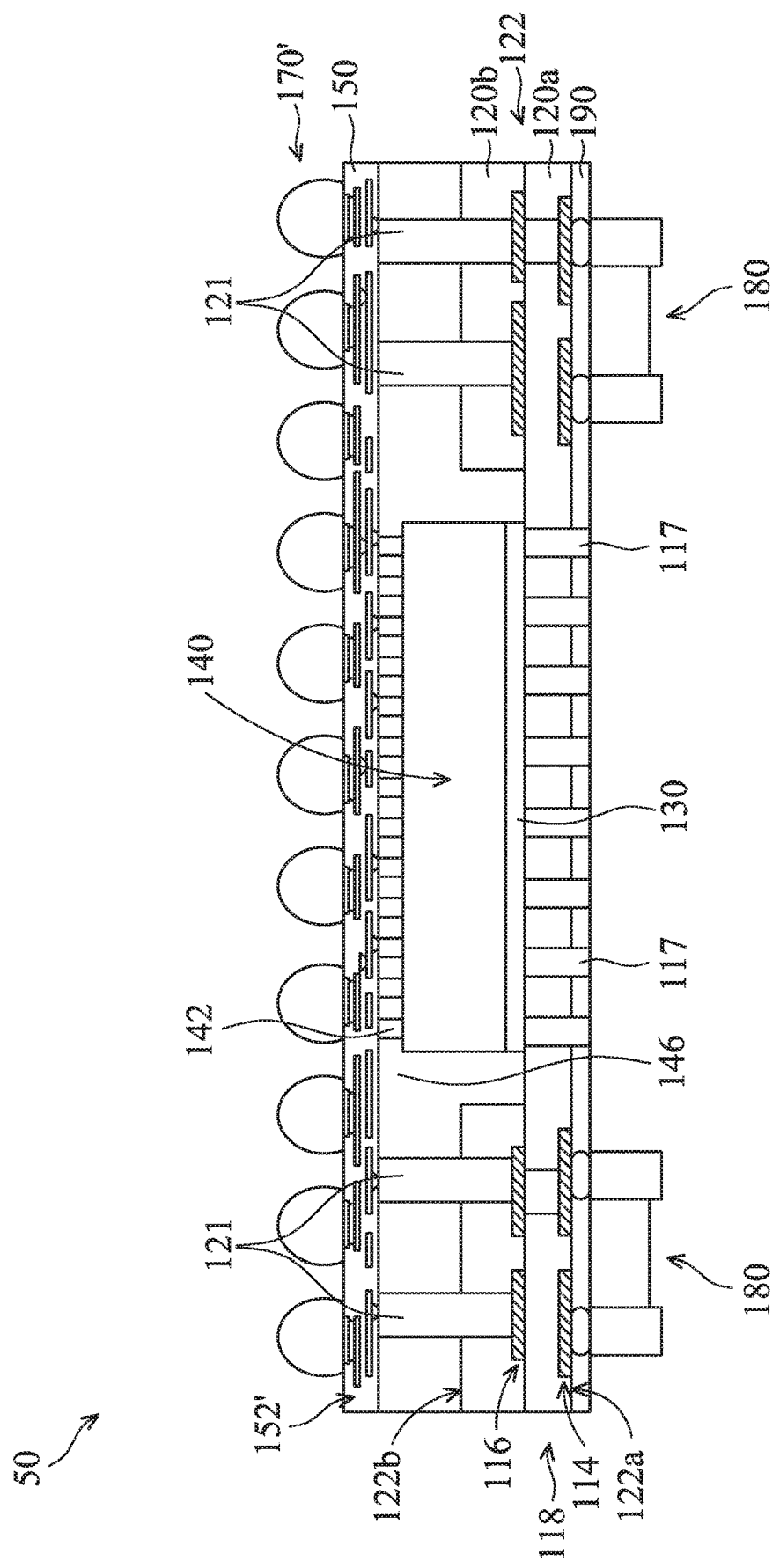
FIG. 9 illustrates a cross-sectional representation of a package structure in accordance with some embodiments.

FIG. 9 illustrates a cross-sectional representation of a package structure 50 in accordance with some embodiments. The package structure 50 shown in FIG. 9 is similar to the package structure 10 shown in FIG. 5G. Unlike the package structure 10, the package structure 50 includes electronic devices 180 formed over first surface 122a of the package substrate 122 and electrically connected to the RDL structure 118. Moreover, the package structure 50 includes conductive connectors 170' formed over the insulating layer 150 and electrically connected to an RDL structure 152' in the insulating layer 150. As a result, the electronic device 140 and the conductive connectors 170' are located at two opposite sides of the insulating layer 150.

Also, the electronic device 140 and the electronic devices 180 are located at two opposite sides of the package substrate 122. In addition, in the package structure 50, a protective or passivation layer 190 is optionally formed to cover the first surface 122a of the package substrate 122, in accordance with some embodiments. In those cases, the conductive features 117 extend through the protective or passivation layer 190, so that a heat spreader (not shown) may be thermally coupled to the conductive features 117 for improving the heat dissipation.

Although the package substrate 122 in the package structure 10 shown in FIG. 5G and the package substrate 122 in the package structure 20 shown in FIG. 6 include a single cavity 124, embodiments of the disclosure are not limited thereto. Many variations and/or modifications can be made to embodiments of the disclosure.

Figure 10:
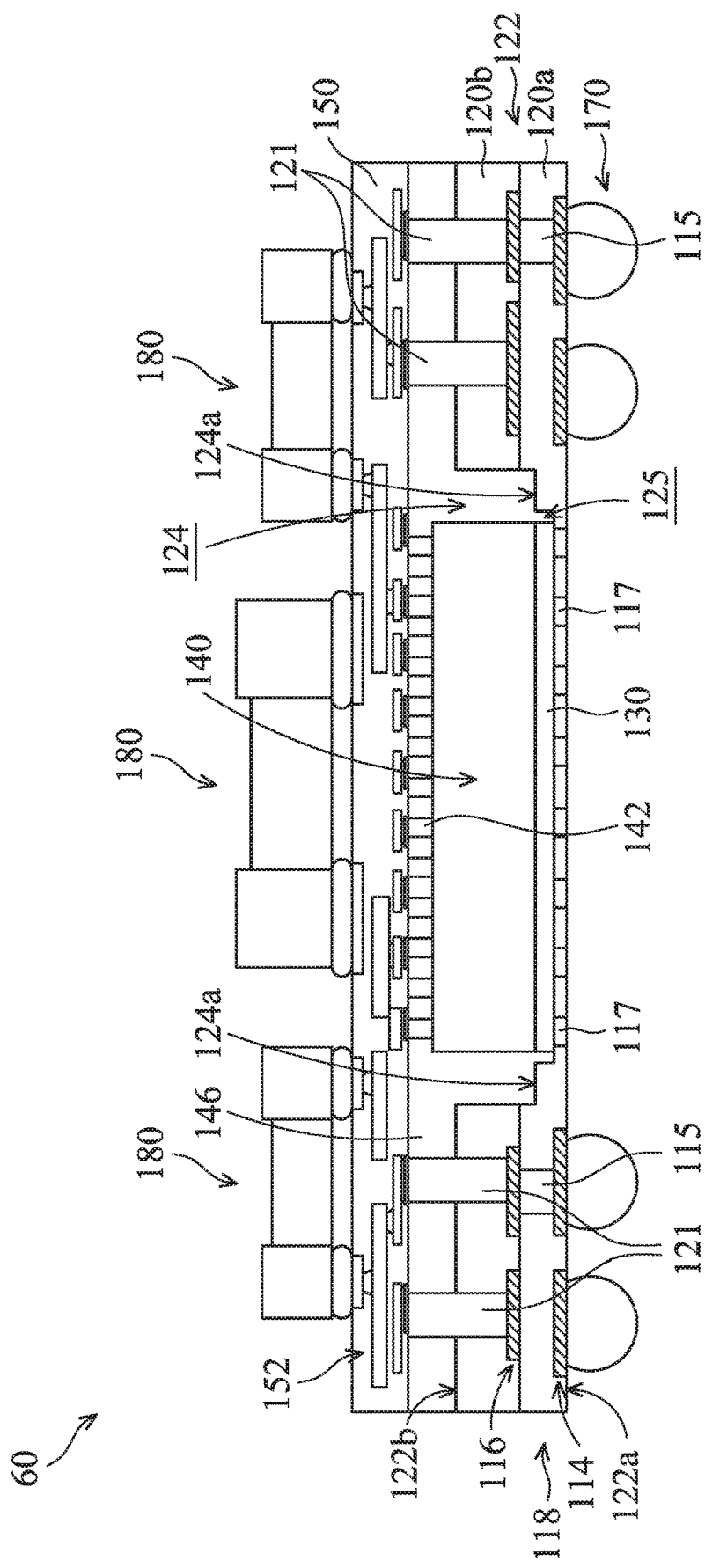
FIG. 10 illustrates a cross-sectional representation of a package structure in accordance with some embodiments.
Figure 11:
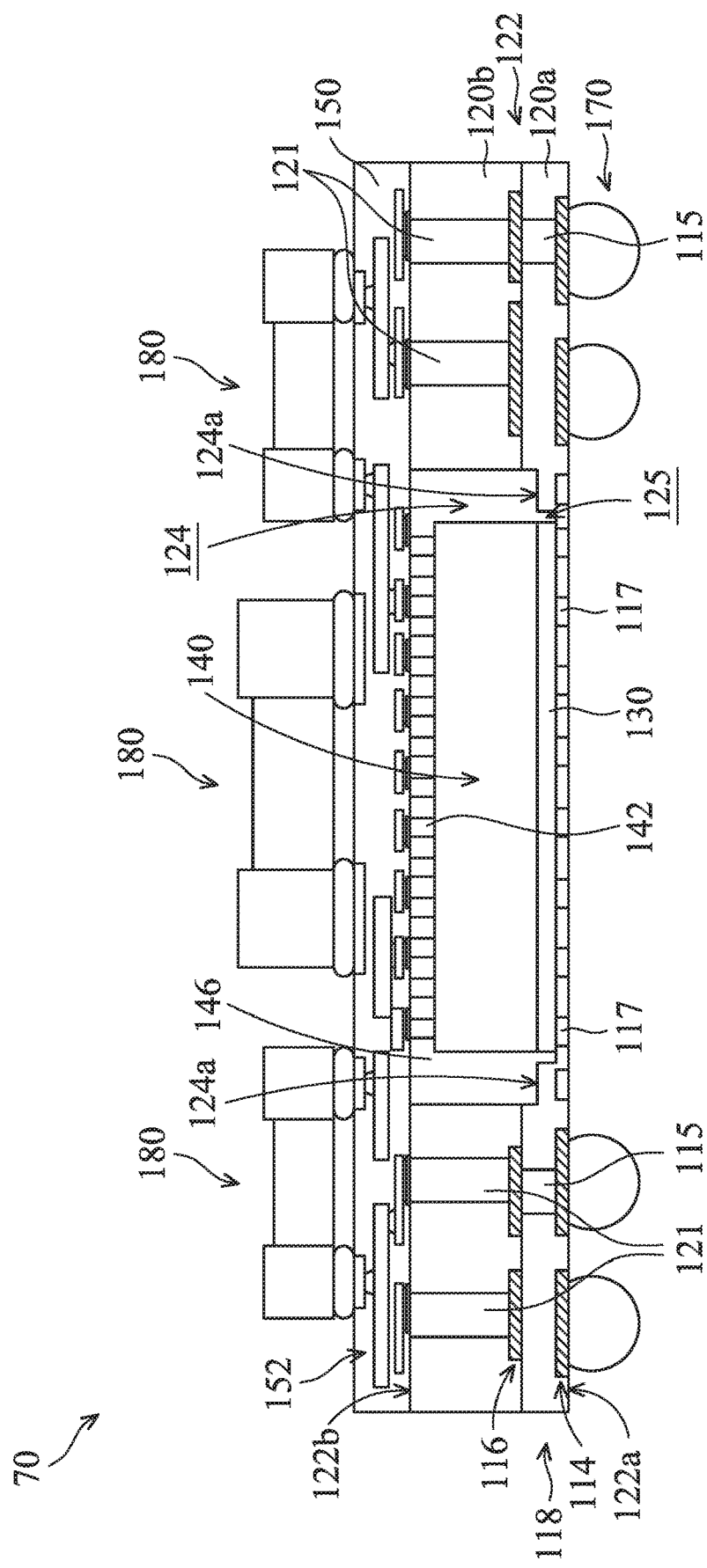
FIG. 11 illustrates a cross-sectional representation of a package structure in accordance with some embodiments.

FIG. 10 illustrates a cross-sectional representation of a package structure 60 in accordance with some embodiments and FIG. 11 illustrates a cross-sectional representation of a package structure 70 in accordance with some embodiments. The package structure 60 is similar to the package structure 10 shown in FIG. 5G and the package structure 70 is similar to the package structure 20 shown in FIG. 6.

Unlike the package structures 10 and 20, the package substrate 122 in the package structures 60 and 70 includes two cavities 124 and 125. More specifically, the cavity 124 extends from the second surface 122b of the package substrate 122 toward the first surface 122a of the package substrate 122. The cavity 125 extends from the bottom surface 124a of the cavity 124 toward the first surface 122a of the package substrate 122. In those cases, thermal features 117 extend from the bottom surface of the cavity 125 to the first surface 122a of the package substrate 122.

In some embodiments, the bottom width of the cavity 124 is greater than the top width of the cavity 125. In those cases, the electronic device 140 has a width less than the top width of the cavity 125, and is formed in the cavities 124 and 125. Moreover, the encapsulating material 146 is formed in the cavities 124 and 125 to extend along sidewalls of the electronic device 140 and between the electronic device 140 and the insulating layer 150.

Embodiments of package structures and methods for forming the same are provided. The formation of the package structure includes etching the top surface of a substrate to form a cavity. At least one electronic device in the cavity of the substrate to thermally coupled to thermal vias that are directly under the bottom surface of the cavity. An encapsulating material is formed in the cavity and an insulating layer having an RDL structure is formed over the encapsulating material and electrically connected to the electronic device. The encapsulating material is sandwiched between the substrate and the insulating layer with the RDL structure. Since the substrate and the insulating layer with the RDL structure provide good rigidity, the package strength can be improved and low package warpage or twist tuning knob can be achieved. Moreover, the cavity of the substrate allows the electronic device partially or entirely within the substrate. As a result, the height of the package structure is reduced, thereby lowering the form factor. Further, the thermal vias embedded in the substrate help the heat dissipation of the electronic device. In addition, the RDL structure not only provides a high input/output density, but also having two opposing sides for the integration of more electronic devices in the package structure. As a result, circuit functions for the package structure can be increased.

In some embodiments, a package structure is provided. The package structure includes a substrate having a first surface and a second surface opposite the first surface. The substrate includes a cavity extending from the second surface toward the first surface, and thermal vias extending from a bottom surface of the cavity to the first surface. The package structure also includes at least one first electronic device formed in the cavity and thermally coupled to the thermal vias. In addition, the package structure includes an insulating layer formed over the second surface and covering the first electronic device. The insulating layer includes a first redistribution layer (RDL) structure electrically connected to the first electronic device. The package structure also includes an encapsulating material formed in the cavity, extending along sidewalls of the first electronic device and between the first electronic device and the insulating layer.

In some embodiments, a package structure is provided. The package structure includes a substrate having a first surface and a second surface opposite the first surface. The substrate includes a first RDL structure, a first cavity extending from the second surface of the substrate toward the first surface of the substrate, and a second cavity extending from a bottom surface of the first cavity toward the first surface of the substrate. A bottom width of the first cavity is greater than a top width of the second cavity. The package structure also includes at least one first electronic device formed in the first cavity and the second cavity and an insulating layer formed over the second surface of the substrate and covering the first electronic device. The insulating layer includes a second RDL structure electrically connected to the first RDL structure and the first electronic device. In addition, the package structure includes an encapsulating material formed in the first cavity, extending along sidewalls of the first electronic device and between the first electronic device and the insulating layer.

In some embodiments, a method for forming a package structure is provided. The method includes etching a top surface of a substrate to form a cavity. The substrate includes thermal vias directly under a bottom surface of the cavity. The method also includes forming at least one first electronic device in the cavity of the substrate. The first electronic device is thermally coupled to the thermal vias. The method further includes forming an encapsulating material in the cavity, so that the encapsulating material extends along sidewalls of the first electronic device and covers a surface of the first electronic device opposite the bottom surface of the cavity. In Addition, the method includes forming an insulating layer having an RDL structure over the encapsulating material. The RDL structure is electrically connected to the first electronic device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a substrate having a first surface and a second surface opposite the first surface, wherein the substrate comprises a cavity extending from the second surface of the substrate toward the first surface of the substrate and a plurality of thermal vias extending from a bottom surface of the cavity to the first surface of the substrate;
   at least one first electronic device formed in the cavity and thermally coupled to the plurality of thermal vias;
   an insulating layer formed over the second surface of the substrate and covering the first electronic device, wherein the insulating layer comprises a first redistribution layer (RDL) structure electrically connected to the first electronic device; and
   an encapsulating material formed in the cavity, extending along sidewalls of the first electronic device and between the first electronic device and the insulating layer.

2. The package structure as claimed in claim 1, further comprising:
   at least one second electronic device formed over the insulating layer and electrically connected to the first RDL structure, so that the first electronic device and the second electronic device are located at two opposite sides of the insulating layer; and
   a plurality of conductive connectors formed over the first surface of the substrate, wherein the substrate further comprises a second RDL structure electrically connected between the plurality of conductive connectors and the first RDL structure.

3. The package structure as claimed in claim 2, wherein at least one of the first electronic device and the second electronic device comprises a semiconductor die, a chiplet, an active device, or a passive device.

4. The package structure as claimed in claim 2, wherein the substrate further comprises a plurality of conductive vias extending from the second RDL structure to the first RDL structure, and wherein the plurality of conductive vias and the plurality of thermal vias are made of different materials.

5. The package structure as claimed in claim 1, further comprising:
   at least one second electronic device formed over the first surface of the substrate, wherein the substrate further comprises a second RDL structure electrically connected to the second electronic device; and
   a plurality of conductive connectors formed over the insulating layer and electrically connected to the first RDL structure, wherein the first electronic device and the plurality of conductive connectors are located at two opposite sides of the insulating layer.

6. The package structure as claimed in claim 1, further comprising:
   at least one second electronic device formed in the cavity and electrically connected to the first RDL structure, wherein the first electronic device and the second electronic device are located at same side of the insulating layer.

7. The package structure as claimed in claim 1, wherein the insulating layer is in direct contact with the second surface of the substrate and a top surface of the encapsulating material formed in the cavity.

8. The package structure as claimed in claim 1, wherein the encapsulating material extends from the cavity to the second surface of the substrate, and wherein the insulating layer is in direct contact with a top surface of the encapsulating material and separated from the substrate and the first electronic device by the encapsulating material.

9. The package structure as claimed in claim 1, further comprising a thermal conductive layer formed in the cavity and thermally coupled between the first electronic device and the plurality of thermal vias.

10. The package structure as claimed in claim 1, wherein the cavity has a top width and a bottom width, and wherein the bottom width is equal to or less than the top width.

11. A package structure, comprising:
a substrate having a first surface and a second surface opposite the first surface, wherein the substrate comprises a first redistribution layer (RDL) structure, a first cavity extending from the second surface of the substrate toward the first surface of the substrate, a second cavity extending from a bottom surface of the first cavity toward the first surface of the substrate, and a plurality of thermal vias extending from a bottom surface of the second cavity to the first surface of the substrate, and wherein a bottom width of the first cavity is greater than a top width of the second cavity;
at least one first electronic device formed in the first cavity and the second cavity;
an insulating layer formed over the second surface of the substrate and covering the first electronic device, wherein the insulating layer comprises a second RDL structure electrically connected to the first RDL structure and the first electronic device; and
an encapsulating material formed in the first cavity, extending along sidewalls of the first electronic device and between the first electronic device and the insulating layer.

12. The package structure as claimed in claim 11, further comprising:
at least one second electronic device formed over the insulating layer and electrically connected to the second RDL structure, wherein the first electronic device and the second electronic device are located at two opposite sides of the insulating layer; and
a plurality of conductive connectors formed over the first surface of the substrate,
wherein the first RDL structure is electrically connected between the plurality of conductive connectors and the second RDL structure.

13. The package structure as claimed in claim 12, wherein at least one of the first electronic device and the second electronic device comprises a semiconductor die, a chiplet, an active device, or a passive device.

14. The package structure as claimed in claim 12, wherein the encapsulating material extends between the second surface of the substrate and a bottom surface of the insulating layer to separate the insulating layer from the substrate.

15. The package structure as claimed in claim 11, wherein a bottom surface of the insulating layer, the second surface of the substrate and a top surface of the encapsulating material are coplanar.

16. The package structure as claimed in claim 11, wherein the encapsulating material has a portion in the first cavity and the second cavity, and the portion of the encapsulating material has a stepped sidewall.

17. A package structure, comprising:
a substrate having a first region and a second region and comprising a plurality of thermal vias in the first region;
at least one first electronic device formed in the first region of the substrate and thermally coupled to the plurality of thermal vias, wherein a bottom surface of the first electronic device is lower than a top surface of the second region of the substrate;
an encapsulating material covering sidewalls of the first electronic device and a top surface of the first electronic device; and
an insulating layer having a redistribution layer (RDL) structure formed over the encapsulating material, wherein the RDL structure is electrically connected to the first electronic device.

18. The package structure as claimed in claim 17, wherein the insulating layer is in direct contact with the second region of the substrate and the encapsulating material.

19. The package structure as claimed in claim 17, wherein the encapsulating material is formed to extend on a top surface of the substrate, so that a bottom surface of the insulating layer is separated from the substrate.

20. The package structure as claimed in claim 17, wherein the first region of the substrate has a first thickness and the second region of the substrate has a second thickness which is greater than the first thickness.

* * * * *